United States Patent
Fujisawa et al.

(10) Patent No.: US 12,236,707 B2
(45) Date of Patent: Feb. 25, 2025

(54) DETECTION DEVICE

(71) Applicant: Japan Display Inc., Tokyo (JP)

(72) Inventors: Akihiko Fujisawa, Tokyo (JP); Takaaki Kono, Tokyo (JP)

(73) Assignee: Japan Display Inc., Tokyo (JP)

( * ) Notice: Subject to any disclaimer, the term of this patent is extended or adjusted under 35 U.S.C. 154(b) by 42 days.

(21) Appl. No.: 18/296,666

(22) Filed: Apr. 6, 2023

(65) Prior Publication Data

US 2023/0326236 A1 Oct. 12, 2023

(30) Foreign Application Priority Data

Apr. 8, 2022 (JP) .................................. 2022-064761

(51) Int. Cl.
*G06V 40/13* (2022.01)
*H10K 39/32* (2023.01)

(52) U.S. Cl.
CPC ......... *G06V 40/1318* (2022.01); *H10K 39/32* (2023.02)

(58) Field of Classification Search
CPC .................. G06F 3/042–0428; G06V 40/1318
See application file for complete search history.

(56) References Cited

U.S. PATENT DOCUMENTS

| | | | |
|---|---|---|---|
| 2009/0303363 A1* | 12/2009 | Blessinger | H04N 25/57 348/300 |
| 2016/0050381 A1* | 2/2016 | Onishi | H04N 25/57 348/300 |
| 2016/0307949 A1* | 10/2016 | Madurawe | H04N 25/709 |
| 2017/0359537 A1* | 12/2017 | Sakano | H04N 25/772 |
| 2018/0012069 A1 | 1/2018 | Chung et al. | |
| 2018/0349666 A1* | 12/2018 | Chen | G06V 40/1359 |

FOREIGN PATENT DOCUMENTS

JP 2019180861 A 10/2019

\* cited by examiner

*Primary Examiner* — Roberto W Flores
(74) *Attorney, Agent, or Firm* — K&L Gates LLP

(57) ABSTRACT

A detection device includes a sensor circuit provided with a first photodiode in a semiconductor layer, and a signal detector configured to acquire a detection value corresponding to a signal output from the sensor circuit. The signal detector includes a first detection circuit coupled to one end of the first photodiode, a first switch circuit configured to apply a power supply potential to another end of the first photodiode, and a second switch circuit configured to short both ends of the first photodiode.

8 Claims, 23 Drawing Sheets

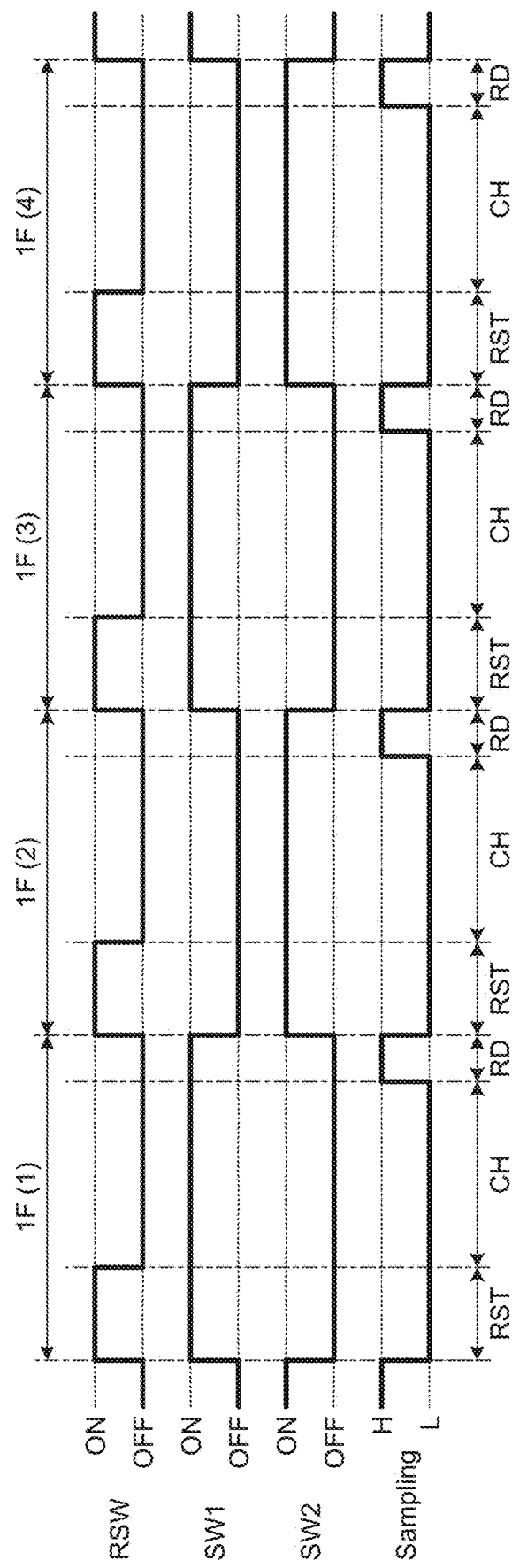

DETECTION DEVICE

CROSS-REFERENCE TO RELATED APPLICATION

This application claims the benefit of priority from Japanese Patent Application No. 2022-064761 filed on Apr. 8, 2022, the entire contents of which are incorporated herein by reference.

BACKGROUND

1. Technical Field

The present disclosure relates to a detection device.

2. Description of the Related Art

United States Patent Application Publication No. 2018/0012069 describes an optical sensor in which a plurality of photoelectric conversion elements such as photodiodes are arranged on a semiconductor substrate. In the optical sensor, signals output from the photoelectric conversion elements change with an amount of irradiating light, thereby enabling detection of biometric information.

Japanese Patent Application Laid-open Publication No. 2019-180861 describes a configuration to acquire an oxygen saturation level in blood (hereinafter, called "blood oxygen saturation level" ($SpO_2$)) using pulse waves acquired using infrared light and pulse waves acquired using red light. The blood oxygen saturation level ($SpO_2$) refers to a ratio of an amount of oxygen actually bound to hemoglobin to the total amount of oxygen under the assumption that the oxygen is bound to all the hemoglobin in the blood.

For example, when acquiring the biometric information such as the pulse waves, a frequency component (at 50 Hz or 60 Hz) of a commercial alternating-current power supply may be superimposed thereon via sensor electrodes to deteriorate the signal-to-noise ratio (S/N) of the biometric information data serving as a detection target.

It is an object of the present disclosure to provide a detection device capable of improving the ratio S/N of the biometric information data serving as a detection target.

SUMMARY

A detection device according to an embodiment of the present disclosure includes a sensor circuit provided with a first photodiode in a semiconductor layer, and a signal detector configured to acquire a detection value corresponding to a signal output from the sensor circuit. The signal detector includes a first detection circuit coupled to one end of the first photodiode, a first switch circuit configured to apply a power supply potential to another end of the first photodiode, and a second switch circuit configured to short both ends of the first photodiode.

BRIEF DESCRIPTION OF THE DRAWINGS

FIG. 9 is a timing waveform diagram illustrating a detection operation example of the detection device according to the first embodiment;

DETAILED DESCRIPTION

Figure 1:
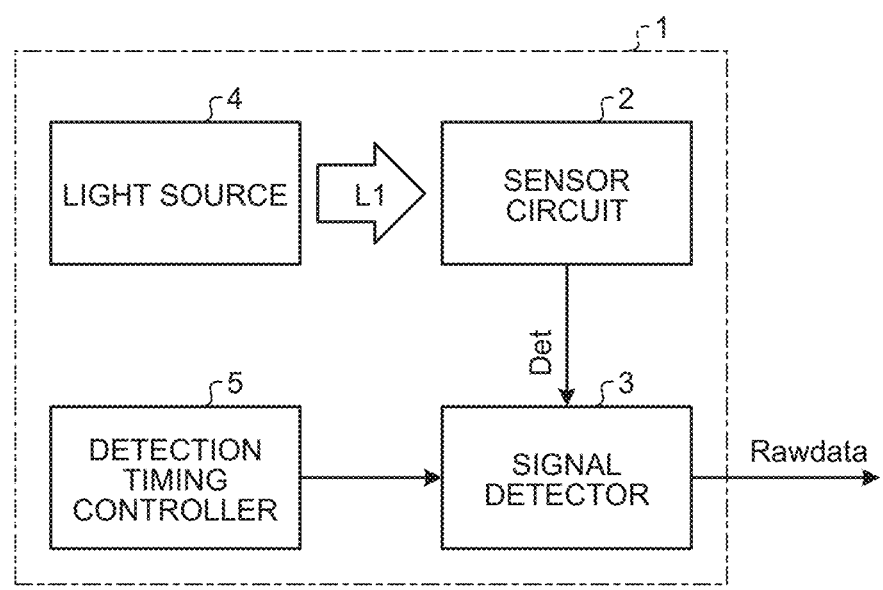
FIG. 1 is a schematic block diagram illustrating a configuration of a detection device according to a first embodiment.

The following describes modes (embodiments) for carrying out the present disclosure in detail with reference to the drawings. The present disclosure is not limited to the description of the embodiments to be given below. Components to be described below include those easily conceivable by those skilled in the art or those substantially identical thereto. In addition, the components to be described below can be combined as appropriate. What is disclosed herein is merely an example, and the present disclosure naturally encompasses appropriate modifications easily conceivable by those skilled in the art while maintaining the gist of the disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the description and the drawings, and detailed description thereof may not be repeated where appropriate.

In the present specification and claims, in expressing an aspect of disposing another structure above a certain structure, a case of simply expressing "above" includes both a case of disposing the other structure immediately above the certain structure so as to contact the certain structure and a case of disposing the other structure above the certain structure with still another structure interposed therebetween, unless otherwise specified.

First Embodiment

FIG. 1 is a schematic block diagram illustrating a configuration of a detection device according to a first embodiment. As illustrated in FIG. 1, a detection device 1 according to the first embodiment includes a sensor circuit 2, a signal detector (a signal detection circuit) 3, a light source 4, and a detection timing controller (a detection timing controlling circuit) 5.

Figure 2A:
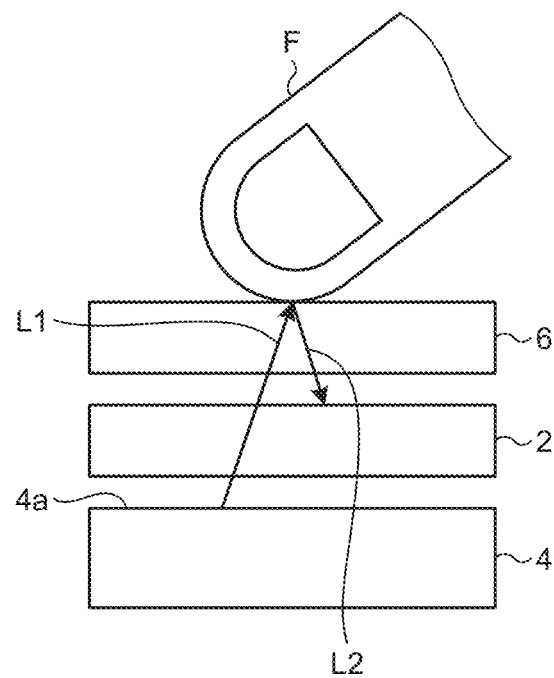
FIG. 2A is a sectional view illustrating an example of a schematic sectional configuration of a detection apparatus to which the detection device according to the first embodiment is applied.
Figure 2B:
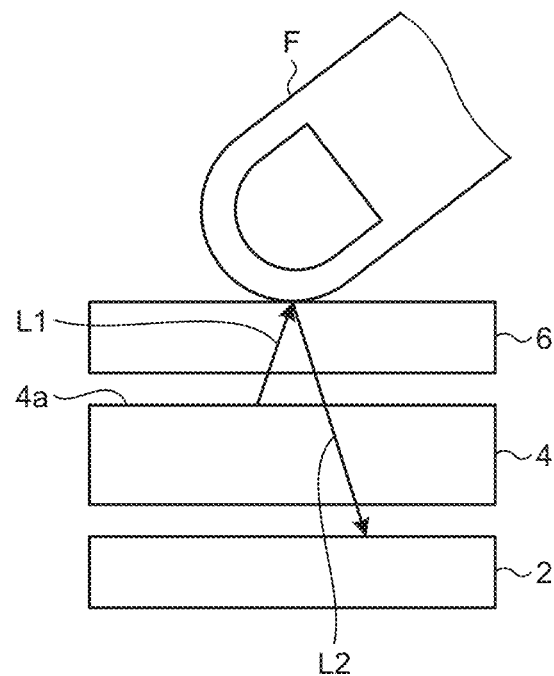
FIG. 2B is a sectional view illustrating a modification of the schematic sectional configuration of the detection apparatus to which the detection device according to the first embodiment is applied.

First, with reference to FIGS. 2A and 2B, the following describes an implementation example of the sensor circuit 2 in a detection apparatus to which the detection device 1 according to first embodiment is applied.

FIG. 2A is a sectional view illustrating an example of a schematic sectional configuration of the detection apparatus to which the detection device according to the first embodiment is applied. The example illustrated in FIG. 2A illustrates an example in which the light source 4, the sensor circuit 2, and a cover glass 6 are stacked in this order in a direction orthogonal to a surface of the sensor circuit 2.

The light source 4 has a light-emitting surface 4a, and emits light L1 from the light-emitting surface 4a toward the sensor circuit 2. For example, light-emitting diodes (LEDs) for emitting light in a predetermined color are used as a light-emitter used for the light source 4.

In FIG. 2A, the light source 4 may be what is called a side light-type backlight or what is called a direct-type backlight. An illumination device 121 is not limited to the backlight, but may be provided on a lateral side or an upper side of the detection device 1, and may emit the light L1, for example, from a lateral side or an upper side of an object F to be detected, such as a finger or a wrist, of a human subject.

The sensor circuit 2 is provided so as to face the light-emitting surface 4a of the light source 4. The light L1 emitted from the light source 4 passes through the sensor circuit 2 and the cover glass 6. The detection device 1 can detect information on a living body (hereinafter, also called "biometric information") in the object F to be detected by causing the sensor circuit 2 to receive light L2 reflected by or transmitted through the object F to be detected, and detecting signals output from the sensor circuit 2. The color of the light L1 from the light source 4 may be varied according to the biometric information (such as pulse waves) serving as a detection target.

The cover glass 6 is a component for protecting the sensor circuit 2 and the light source 4, and covers the sensor circuit 2 and the light source 4. The cover glass 6 is a glass substrate, for example. The cover glass 6 is not limited to the glass substrate, but may be a resin substrate, for example. The cover glass 6 need not be provided. In that case, a protective film is provided on the surface of the sensor circuit 2, and the object F to be detected, such as the finger or the wrist, of the human subject contacts the protective film of the sensor circuit 2.

FIG. 2B is a sectional view illustrating a modification of the schematic sectional configuration of the detection apparatus to which the detection device according to the first embodiment is applied. The modification illustrated in FIG. 2B illustrates an example in which the sensor circuit 2, the light source 4, and the cover glass 6 are stacked in this order in the direction orthogonal to the surface of the sensor circuit 2.

The light L1 emitted from the light source 4 passes through the cover glass 6, and then, is reflected by or transmitted through the object F to be detected. The light L2 reflected by or transmitted through the object F to be detected passes through the cover glass 6, and further passes through the light source 4. The detection device 1 can acquire the biometric information (such as the pulse waves) serving as the detection target by causing the sensor circuit 2 to receive the light L2 transmitted through the light source 4, and detecting the electrical signals output from the sensor circuit 2.

Figure 3A:
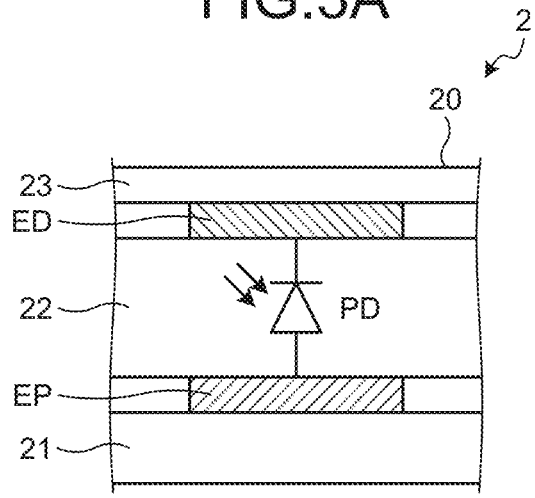
FIG. 3A is a sectional view illustrating a first example of a schematic configuration of a sensor circuit of the detection device according to the first embodiment.
Figure 3B:
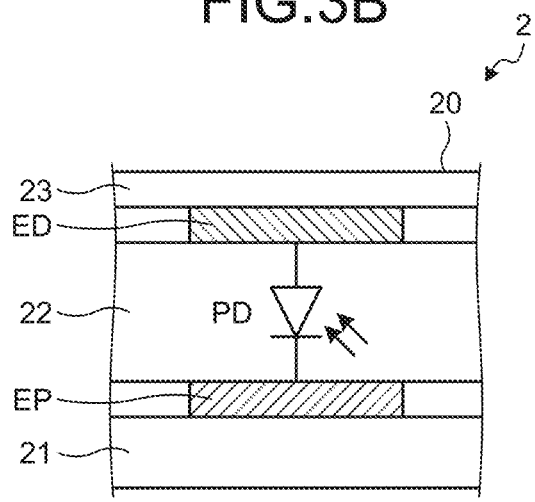
FIG. 3B is a sectional view illustrating a second example of the schematic configuration of the sensor circuit of the detection device according to the first embodiment.
Figure 3C:
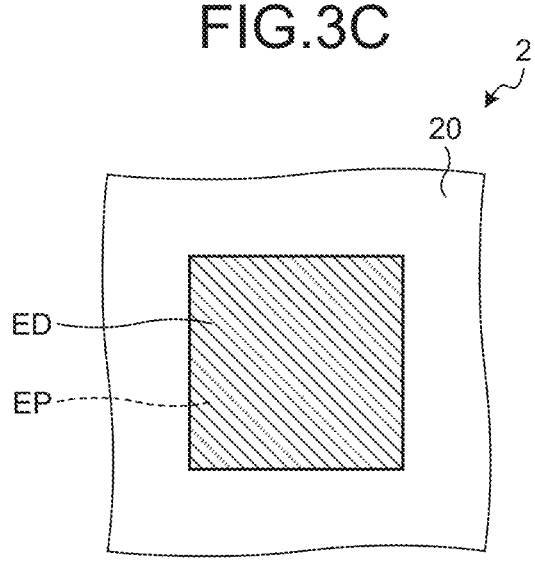
FIG. 3C is a plan view of the sensor circuit illustrated in FIG. 3A or 3B as viewed from a detection surface side.

FIG. 3A is a sectional view illustrating a first example of a schematic configuration of the sensor circuit of the detection device according to the first embodiment. FIG. 3B is a sectional view illustrating a second example of the schematic configuration of the sensor circuit of the detection device according to the first embodiment. FIG. 3C is a plan view of the sensor circuit illustrated in FIG. 3A or 3B as viewed from a detection surface side.

The sensor circuit 2 includes a sensor base material 21, a power supply electrode EP, a semiconductor layer 22, a detection electrode (first detection electrode) ED, and an insulating layer 23. The sensor base material 21 is an insulating base material, and is made using, for example, glass or a resin material. The sensor base material 21 is not limited to having a flat plate shape, but may have a curved surface. In this case, the sensor base material 21 can be a film-like resin.

The sensor base material 21 has a first surface on a side closer to a detection surface 20 for the object F to be detected, and a second surface on the opposite side of the first surface. The power supply electrode EP, the semiconductor layer 22, the detection electrode ED, and the insulating layer 23 are stacked in this order on the first surface. The insulating layer 23 is a protective film covering the detection electrode ED.

The semiconductor layer 22 is formed of amorphous silicon (a-Si), for example. The semiconductor layer 22 includes an i-type semiconductor layer, a p-type semiconductor layer, and an n-type semiconductor layer. The i-type semiconductor layer, the p-type semiconductor layer, and the n-type semiconductor layer form a positive-intrinsic-negative (PIN) photodiode that is a specific example of a photoelectric conversion element. The semiconductor layer 22 may be a photoelectric conversion element made of an organic semiconductor.

FIG. 3A illustrates an example in which the n-type semiconductor layer, the i-type semiconductor layer, and the p-type semiconductor layer are stacked in this order in a direction orthogonal to a surface of the sensor base material 21. In the example illustrated in FIG. 3A, the anode of a photodiode PD is coupled to the power supply electrode EP, and the cathode thereof is coupled to the detection electrode ED.

FIG. 3B illustrates an example in which the p-type semiconductor layer, the i-type semiconductor layer, and the n-type semiconductor layer are stacked in this order in the direction orthogonal to the surface of the sensor base material 21. In the example illustrated in FIG. 3B, the anode of the photodiode PD is coupled to the detection electrode ED, and the cathode thereof is coupled to the power supply electrode EP.

For example, a light-transmitting conductive material such as indium tin oxide (ITO) is used for the power supply electrode EP and the detection electrode ED. As illustrated in FIG. 3C, the detection electrode ED is provided so as to overlap the power supply electrode EP when the sensor circuit 2 is viewed from the detection surface 20 side.

Figure 4:
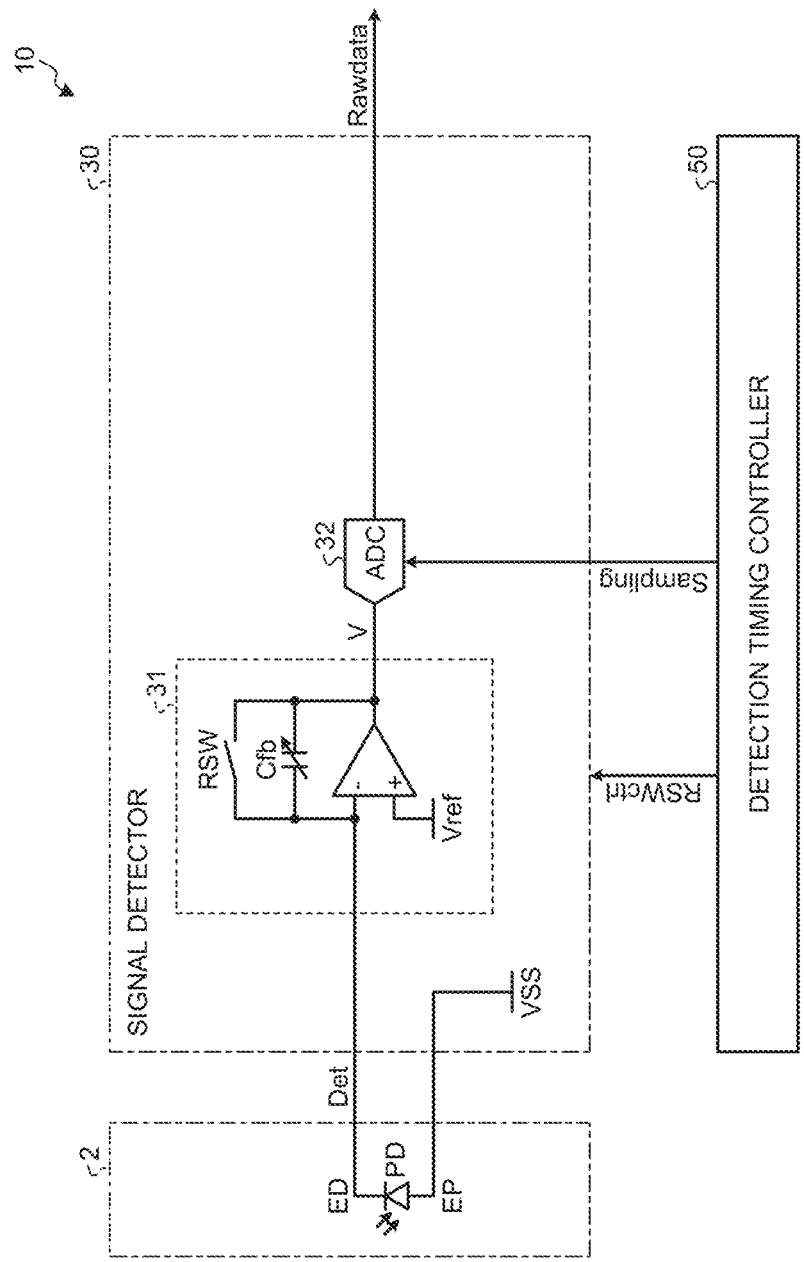
FIG. 4 is a block diagram illustrating a specific configuration of a detection device according to a comparative example.
Figure 5:
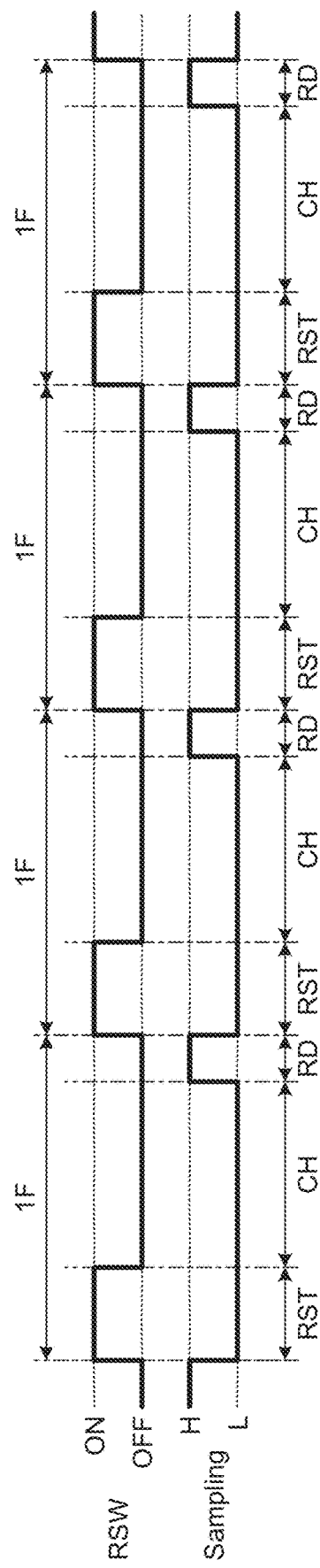
FIG. 5 is a timing waveform diagram illustrating a detection operation example of the detection device according to the comparative example.

FIG. 4 is a block diagram illustrating a specific configuration of a detection device according to a comparative example. FIG. 5 is a timing waveform diagram illustrating a detection operation example of the detection device according to the comparative example.

A detection device 10 according to the comparative example includes a signal detector 30 and a detection timing controller 50. FIG. 4 illustrates the sensor circuit 2 in the aspect illustrated in FIG. 3A.

The signal detector 30 includes a detection circuit 31 formed of a differential amplifier circuit, and an analog-to-digital converter (ADC) 32, as a basic configuration for performing a detection operation.

A power supply potential VSS is applied from the signal detector 30 to the power supply electrode EP coupled to the anode of the photodiode PD in the sensor circuit 2, and the cathode of the photodiode PD is coupled to the inverting input (−) of the differential amplifier circuit forming the detection circuit 31.

As illustrated in FIG. 5, the detection device 10 includes a reset period RST, an exposure period CH, and a read period RD. The detection device 1 assumes a sequence of transition processes of the reset period RST, the exposure period CH, and the read period RD to be described below as one frame (1F), and performs the detection operation at, for example, 1 kHz. The detection timing controller 50 performs on-off control of a reset switch circuit RSW. The detection timing controller 50 also controls the sampling period of the A/D converter 32.

Specifically, the power supply electrode EP is supplied with the power supply potential VSS over the reset period RST, the exposure period CH, and the read period RD. The sensor circuit 2 is irradiated with the light L1 from the light source 4 over the reset period RST, the exposure period CH, and the read period RD.

The detection timing controller 50 controls the reset switch circuit RSW of the detection circuit 31 to be on during the reset period RST. This operation supplies a reference potential Vref applied to the non-inverting input (+) of the differential amplifier circuit to the anode of the photodiode PD. In the configuration using the sensor circuit 2 in the aspect illustrated in FIG. 3A, a relation VSS<Vref holds. In the configuration using the sensor circuit 2 in the aspect illustrated in FIG. 3B, a power supply potential VDD is applied from the signal detector 30 to the power supply electrode EP coupled to the cathode of the photodiode PD in the sensor circuit 2. This operation supplies the power supply potential VDD to the cathode of the photodiode PD, so that VDD>Vref. As a result, a reverse bias is applied between the anode and the cathode of the photodiode PD. At this time, the photodiode PD is charged with an electric charge corresponding to the reverse bias voltage.

The detection timing controller 50 controls the reset switch circuit RSW to be off during the exposure period CH. As a result, the electric charge with which the photodiode PD has been charged by the irradiation of the light L1 is gradually discharged and moves to a negative feedback capacitor Cfb of the differential amplifier circuit, and the output voltage of the detection circuit 31 is set to a voltage corresponding to the electric charge stored in the negative feedback capacitor Cfb.

The A/D converter 32 of the signal detector 30 samples a detection value V that is the output voltage of the detection circuit 31 and converts the detection value V into a discrete detection value Rawdata during the read period RD.

Figure 6:
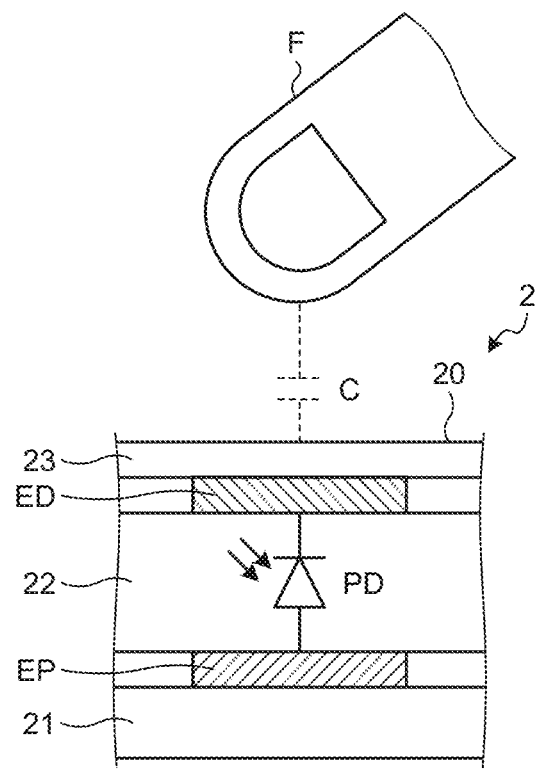
FIG. 6 is a schematic diagram for explaining an effect by a capacitive component generated between an object to be detected and a detection electrode.
Figure 7:
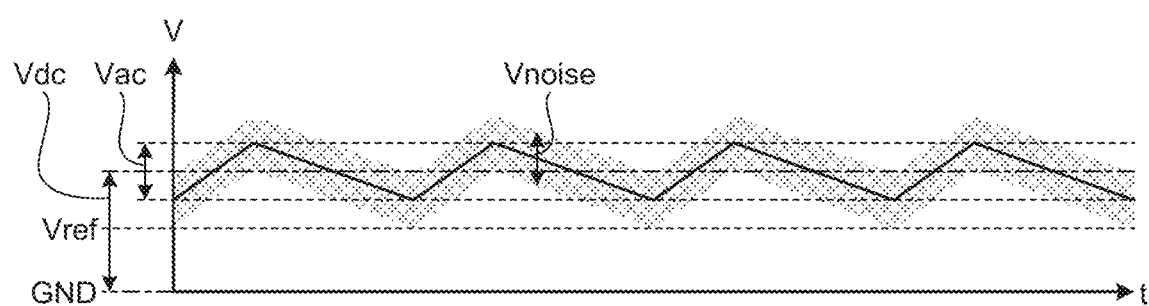
FIG. 7 is a waveform diagram illustrating an example of a detection value of a detection circuit in the comparative example illustrated in FIG. 4.

FIG. 6 is a schematic diagram for explaining an effect by a capacitive component generated between the object to be detected and the detection electrode. FIG. 7 is a waveform diagram illustrating an example of the detection value of the detection circuit in the comparative example illustrated in FIG. 4. FIG. 7 illustrates an example of acquiring pulse wave data as an example of the biometric information data serving as the detection target. FIG. 7 indicates a variation of a pulse wave component with a solid line, and a noise component Vnoise superimposed on the pulse wave component with a shading. The waveform of the pulse wave component is a waveform obtained by superimposing an alternating-current (AC) component Vac on a direct-current (DC) component Vdc.

A frequency component (at, for example, 50 Hz or 60 Hz) of a commercial alternating-current power supply may be superimposed on an electrical signal Det output from the sensor circuit 2 in the configuration illustrated in FIG. 3A or 3B explained above via a capacitance component C generated between the object F to be detected and the detection electrode ED. This phenomenon may cause the ratio S/N to deteriorate due to the noise component Vnoise superimposed on the pulse wave component serving as the detection target, as illustrated in FIG. 7.

The following describes configurations and operations that can improve the ratio S/N of the biometric information data (such as the pulse wave data) serving as the detection target.

Figure 8:
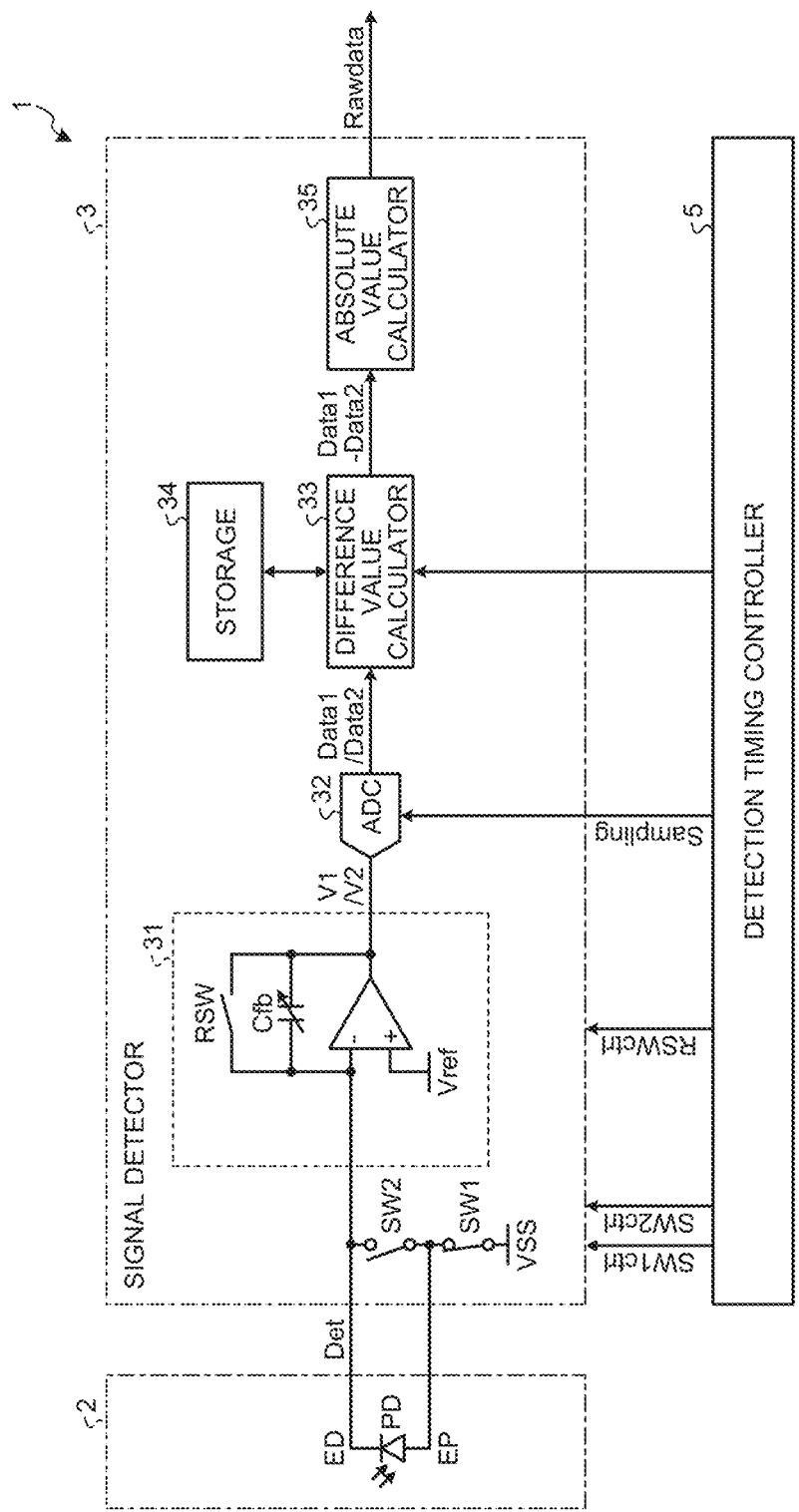
FIG. 8 is a block diagram illustrating a specific configuration of the detection device according to the first embodiment.

FIG. 8 is a block diagram illustrating a specific configuration of the detection device according to the first embodiment. FIG. 9 is a timing waveform diagram illustrating a detection operation example of the detection device according to the first embodiment. The following describes details of differences from the comparative example described above, and may omit the same description as that of the comparative example.

In the detection device 1 according to the first embodiment, the signal detector 3 includes a first switch circuit SW1 that applies the power supply potential VSS (or VDD) to the anode of the photodiode (first photodiode) PD and a second switch circuit SW2 that couples together the anode and the cathode of the photodiode (first photodiode) PD. That is, the second switch circuit SW2 shorts both ends of the photodiode (first photodiode) PD. The detection timing controller 5 performs on-off control of the first switch circuit SW1 and the second switch circuit SW2, in addition to the on-off control of the reset switch circuit RSW and the control of the sampling period of the A/D converter 32.

The signal detector 3 has two states of a first state in which the first switch circuit SW1 is controlled to be on and the second switch circuit SW2 is controlled to be off, and a second state in which the first switch circuit SW1 is controlled to be off and the second switch circuit SW2 is controlled to be on. The first switch circuit SW1 is controlled to be on or off by a first switch control signal SW1ctrl output from the detection timing controller 5. The second switch circuit SW2 is controlled to be on or off by a second switch control signal SW2ctrl output from the detection timing controller 5.

The switching between the first and the second states is synchronized with the frame in which the detection operation is performed. That is, the switching period between the first state and the second state is equal to the sampling period in the A/D converter 32.

Figure 10A:
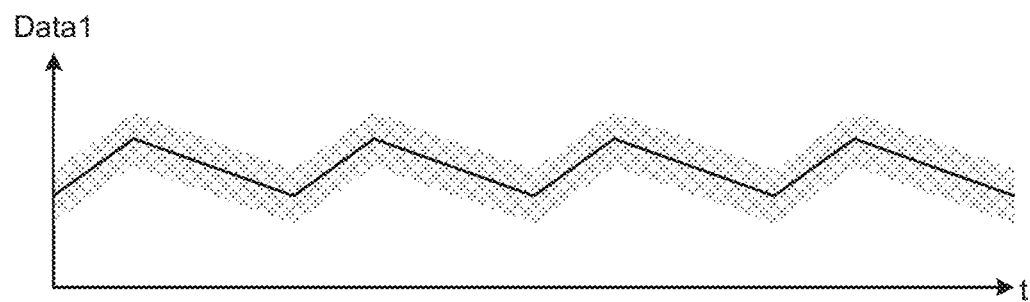
FIG. 10A is a waveform diagram illustrating an example of the detection value acquired in a first state.
Figure 10B:
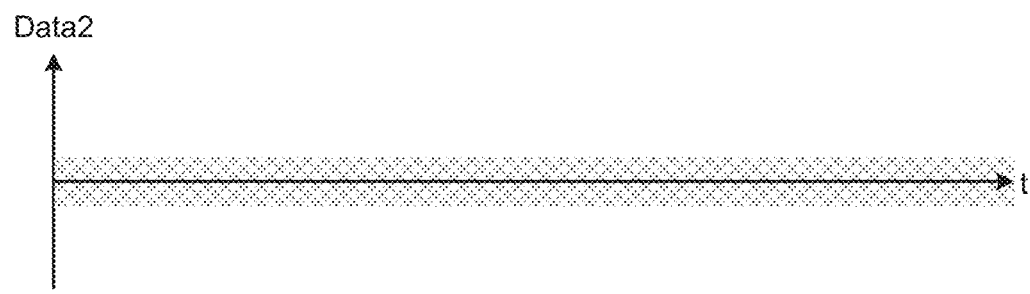
FIG. 10B is a waveform diagram illustrating an example of the detection value acquired in a second state.

Specifically, the detection timing controller 5 establishes the first state in odd-numbered frames 1F(1), 1F(3), . . . , illustrated in FIG. 9, and the second state in the even-numbered frames 1F(2), 1F(4), . . . , illustrated in FIG. 9. As a result, the A/D converter 32 converts a detection value V1 including the pulse wave component and the noise component into a discrete detection value Data1 in the odd-numbered frames 1F(1), 1F(3), . . . , and converts a detection value V2 including no pulse wave into a discrete detection value Data2 in the even-numbered frames 1F(2), 1F(4), . . . . FIG. 10A is a waveform diagram illustrating an example of the detection value acquired in the first state. FIG. 10B is a waveform diagram illustrating an example of the detection value acquired in the second state.

The signal detector 3 outputs the absolute value (|Data1−Data2|) of the difference value (Data1−Data2) between the detection value Data1 and the detection value Data2 acquired between the successive frames as the detection value Rawdata.

Figure 10C:
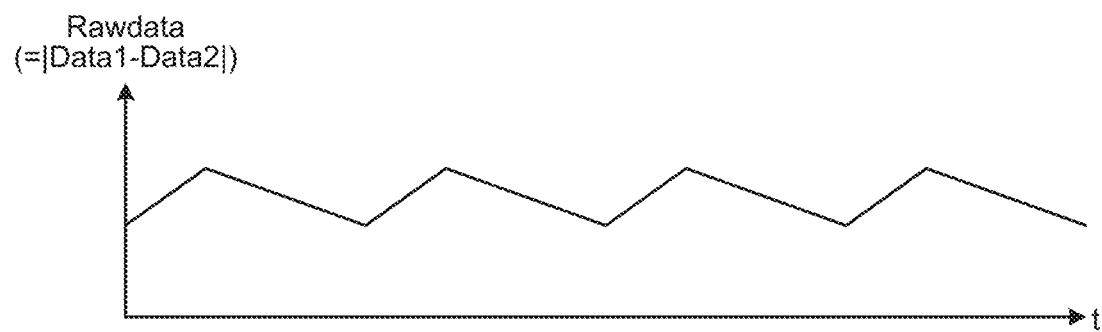
FIG. 10C is a waveform diagram illustrating an absolute value of a difference value between the detection value acquired in the first state illustrated in FIG. 10A and the detection value acquired in the second state illustrated in FIG. 10B.

Specifically, the signal detector 3 includes, for example, a difference value calculator (a difference value calculating circuit) 33, a storage (a storage curcuit) 34, and an absolute value calculator (an absolute value calculating circuit) 35 (refer to FIG. 8). The difference value calculator 33 temporarily stores the detection value Data1 (or the detection value Data2) acquired in the (n−1)th frame (where, n is a natural number) in the storage 34, and calculates the difference value (Data1−Data2) with respect to the detection value Data2 (or the detection value Data1) acquired in the nth frame. The detection timing controller 5 controls the processing timing in the difference value calculator 33 of the present embodiment. The absolute value calculator 35 calculates the absolute value (|Data1−Data2|) of the difference value (Data1−Data2) output from the difference value calculator 33, and outputs the result as the detection value Rawdata in the nth frame. FIG. 10C is a waveform diagram illustrating the absolute value of the difference value between the detection value acquired in the first state illustrated in FIG. 10A and the detection value acquired in the second state illustrated in FIG. 10B.

In the present embodiment, the sampling frequency of the A/D converter 32 is set to a sufficiently higher frequency (at, for example, 1 kHz) than the frequency of the noise component (herein, the frequency of the commercial AC power supply at, for example, 50 Hz or 60 Hz). As a result, the pulse wave component having a reduced noise component is output as the detection value Rawdata, as illustrated in FIG. 10C.

Figure 11:
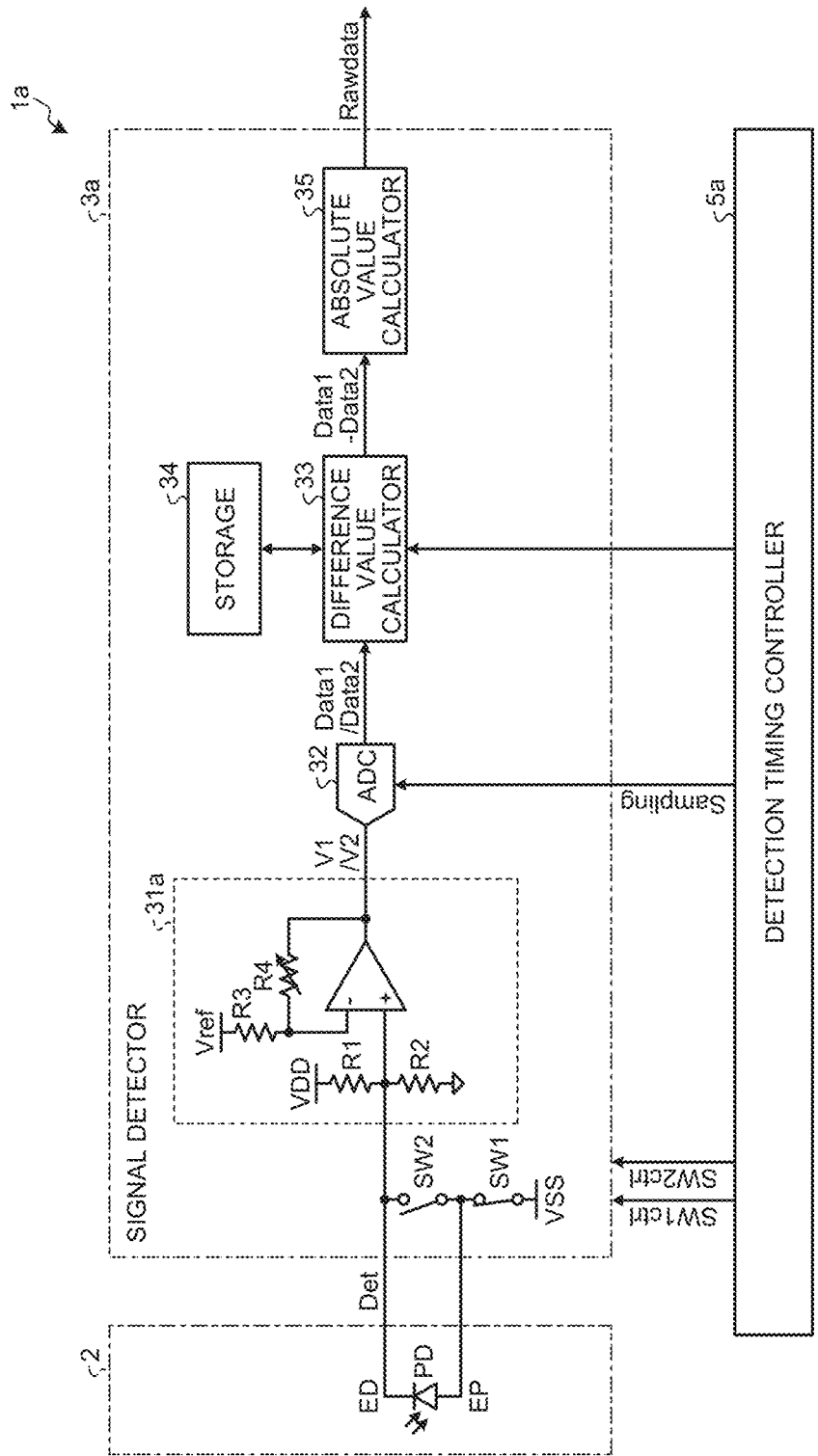
FIG. 11 is a block diagram illustrating a specific configuration of a detection device according to a modification of the first embodiment.

FIG. 11 is a block diagram illustrating a specific configuration of a detection device according to a modification of the first embodiment. Compared with the configuration illustrated in FIG. 8, a signal detector 3a of a detection device 1a illustrated in FIG. 11 has a modified circuit configuration of a detection circuit 31a. A detection timing controller 5a performs the on-off control of the first switch circuit SW1 and the second switch circuit SW2 in the same manner as the detection timing controller 5 illustrated in FIG. 8.

In the configuration according to the modification of the first embodiment illustrated in FIG. 11, in the same manner as in the configuration illustrated in FIG. 8, the sampling frequency of the A/D converter 32 is also set to a sufficiently higher frequency (at, for example, 1 kHz) than the frequency of the noise component (herein, the frequency of the commercial AC power supply at, for example, 50 Hz or 60 Hz). The first state and the second state are alternately switched therebetween in synchronization with the sampling period in the A/D converter 32, and the absolute value (|Data1−Data2|) of the difference value (Data1−Data2) between the detection value Data1 in the first state and the detection value Data2 in the second state acquired between the successive frames is output as the detection value Rawdata. As a result, the pulse wave component having a reduced noise component is output as the detection value Rawdata.

The configurations and the operations of the detection device 1 according to the first embodiment and the detection device 1a according to the modification of the first embodiment described above can improve the ratio S/N of the biometric information data (such as the pulse wave data) serving as the detection target.

In the first embodiment and the modification of the first embodiment described above, the examples have been described in which the absolute value (|Data1−Data2|) of the difference value (Data1−Data2) between the detection value Data1 and the detection value Data2 acquired between the successive frames is output as the detection value Rawdata. However, the present disclosure is not limited to these examples, but may have an aspect in which the difference value (Data1−Data2) between the detection value Data1 and the detection value Data2 acquired between the successive frames is output as the detection value Rawdata. This aspect can omit the absolute value calculation process in the absolute value calculator 35 although the resolution of the detection value Rawdata is halved.

Second Embodiment

The following describes details of differences from the first embodiment described above, and may omit the same description as that of the first embodiment.

Figure 12A:
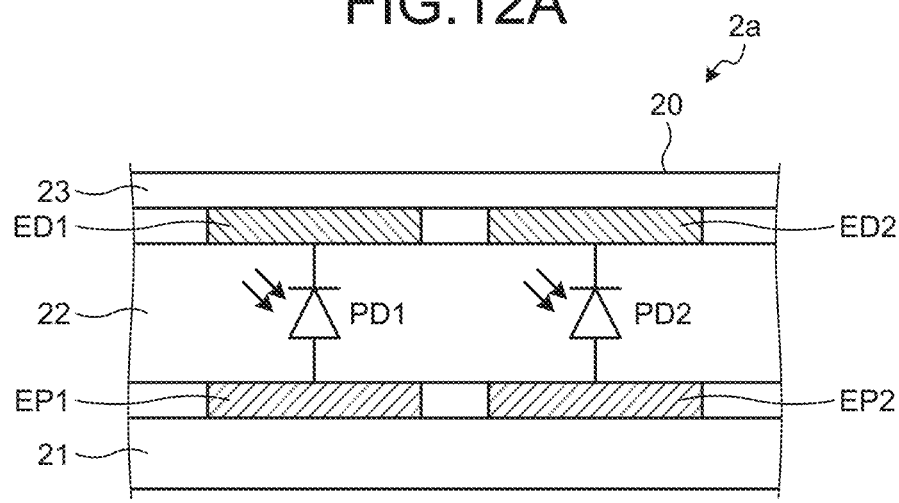
FIG. 12A is a sectional view illustrating a first example of a schematic configuration of a sensor circuit of a detection device according to a second embodiment.
Figure 12B:
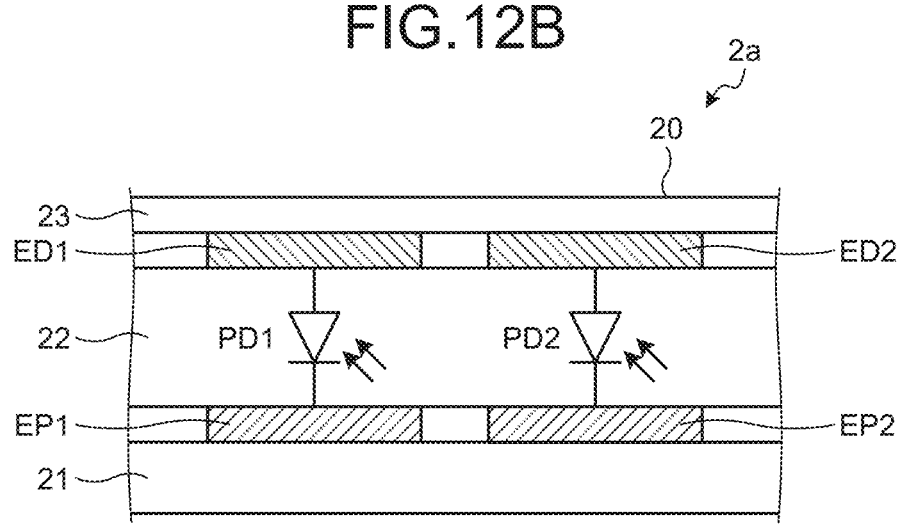
FIG. 12B is a sectional view illustrating a second example of the schematic configuration of the sensor circuit of the detection device according to the second embodiment.
Figure 12C:
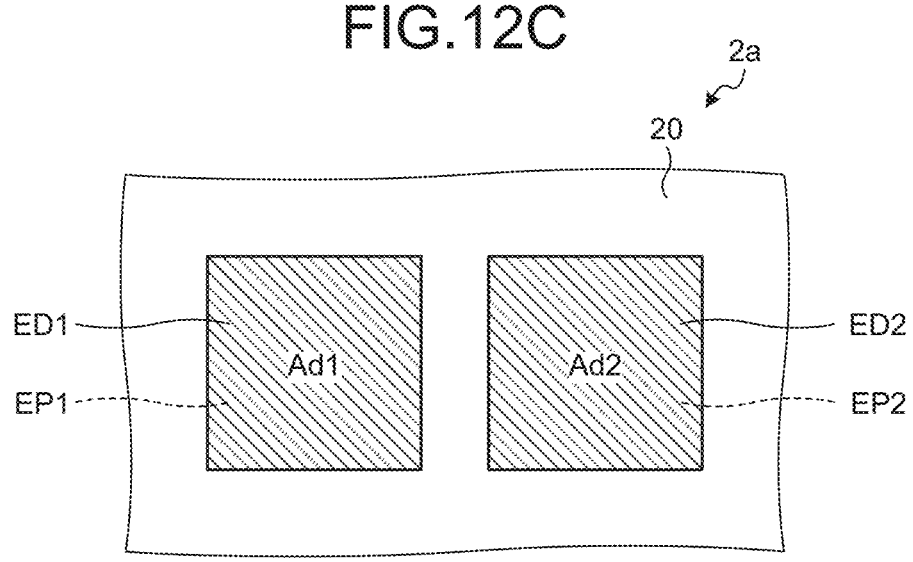
FIG. 12C is a plan view of the sensor circuit illustrated in FIGS. 12A and 12B as viewed from the detection surface side.

FIG. 12A is a sectional view illustrating a first example of a schematic configuration of a sensor circuit of a detection device according to a second embodiment. FIG. 12B is a sectional view illustrating a second example of the schematic configuration of the sensor circuit of the detection device according to the second embodiment. FIG. 12C is a plan view of the sensor circuit illustrated in FIGS. 12A and 12B as viewed from the detection surface side.

As illustrated in FIGS. 12A and 12B, in the present embodiment, a sensor circuit 2a is provided with a first photodiode PD1 and a second photodiode PD2 adjacent to each other.

In the configuration illustrated in FIG. 12A, the anode of the first photodiode PD1 is coupled to a first power supply electrode EP1, and the cathode of the first photodiode PD1 is coupled to a first detection electrode ED1. The anode of the second photodiode PD2 is coupled to a second power supply electrode EP2, and the cathode of the second photodiode PD2 is coupled to a second detection electrode ED2.

In the configuration illustrated in FIG. 12B, the anode of the first photodiode PD1 is coupled to the first detection electrode ED1, and the cathode of the first photodiode PD1 is coupled to the first power supply electrode EP1. The anode of the second photodiode PD2 is coupled to the second detection electrode ED2, and the cathode of the second photodiode PD2 is coupled to the second power supply electrode EP2.

Figure 13:
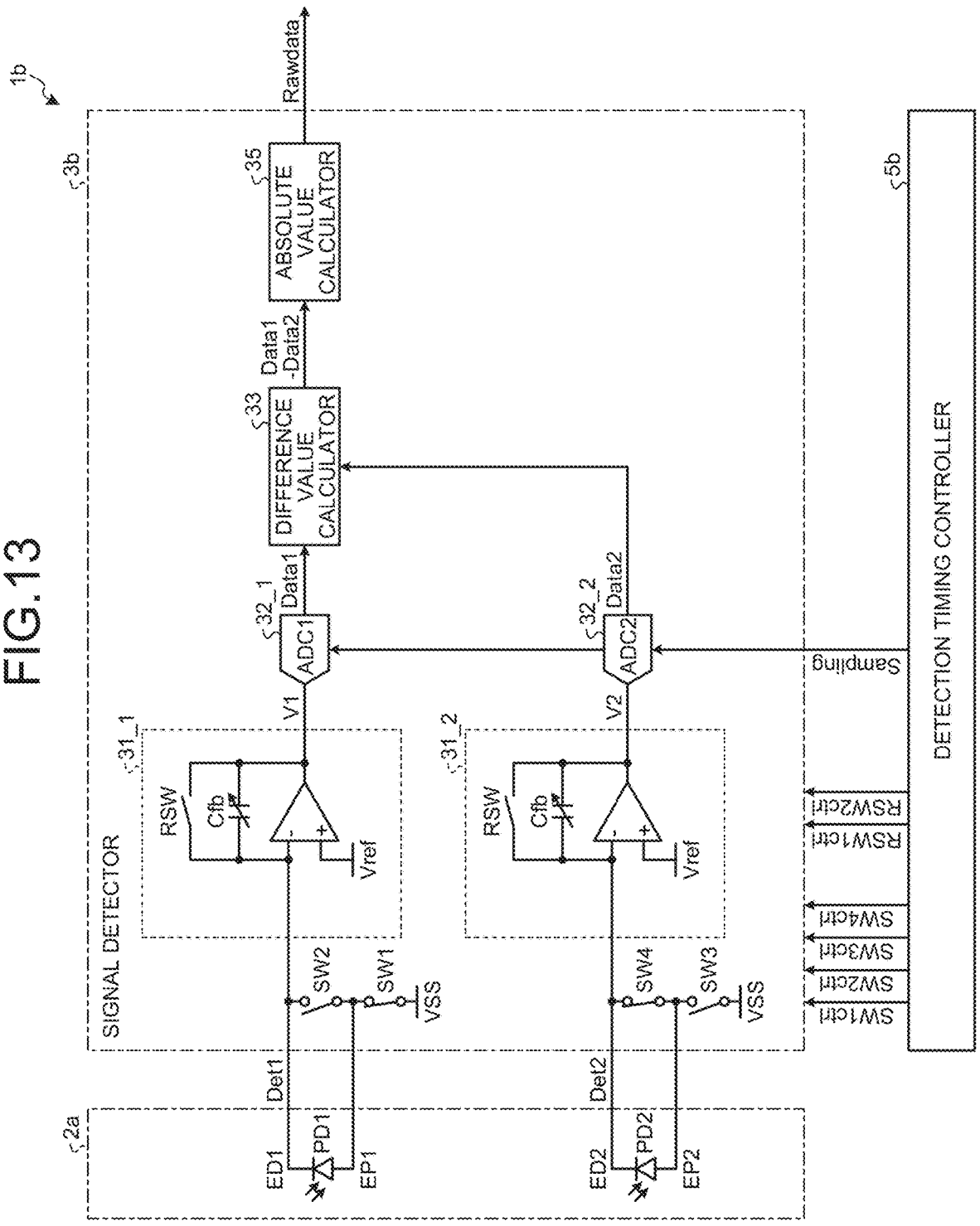
FIG. 13 is a block diagram illustrating a specific configuration of the detection device according to the second embodiment.
Figure 14:
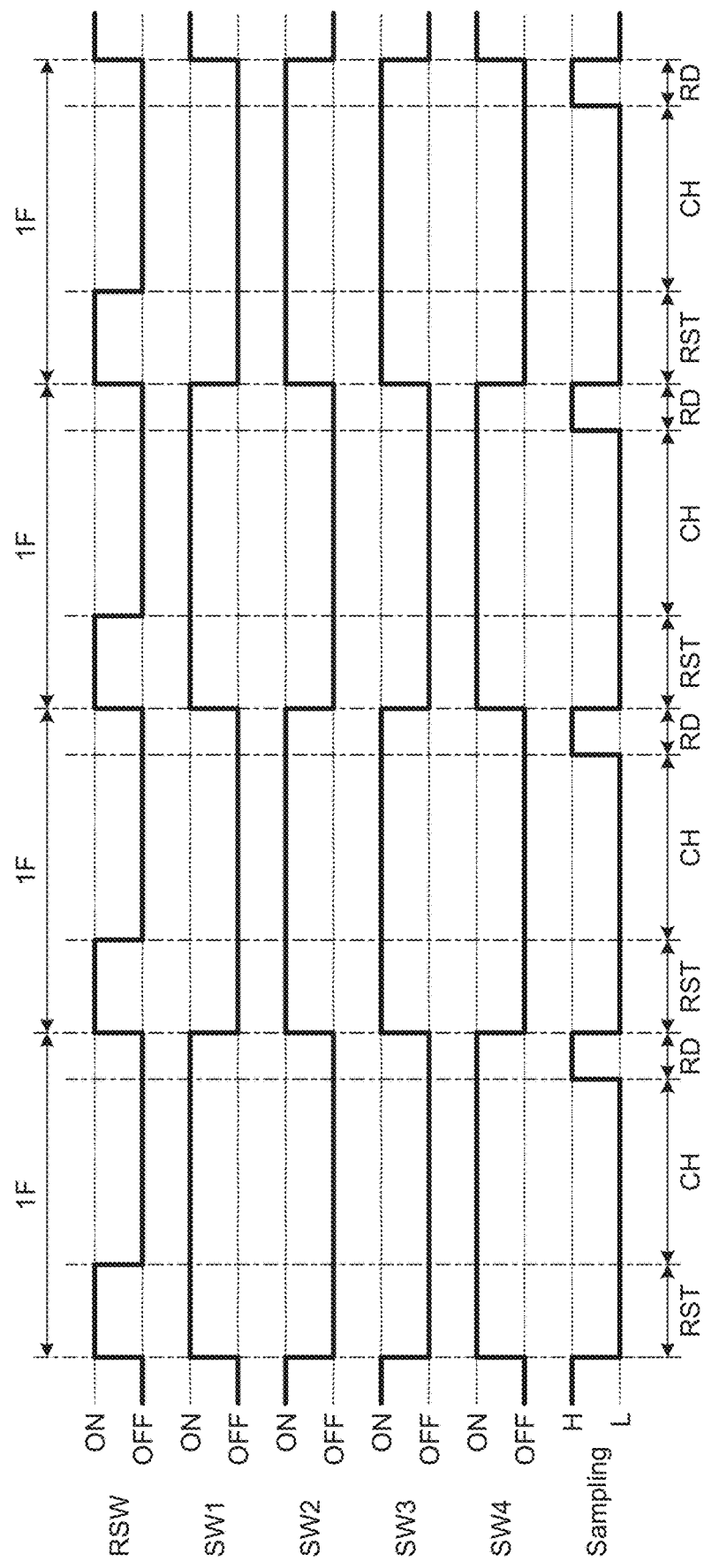
FIG. 14 is a timing waveform diagram illustrating a detection operation example of the detection device according to the second embodiment.

FIG. 13 is a block diagram illustrating a specific configuration of the detection device according to the second embodiment. FIG. 14 is a timing waveform diagram illustrating a detection operation example of the detection device according to the second embodiment.

A signal detector 3b includes a first detection circuit 31_1 and a second detection circuit 31_2 each formed of a differential amplifier circuit, a first A/D converter (ADC1) 32_1, and a second A/D converter (ADC2) 32_2, as a basic configuration for performing the detection operation.

In a detection device 1b according to the second embodiment, the signal detector 3b includes the first switch circuit SW1 that applies the power supply potential VSS (or VDD) to the anode of the first photodiode PD1, and the second switch circuit SW2 that couples together the anode and the cathode of the first photodiode PD1. That is, the second switch circuit SW2 shorts both ends of the first photodiode PD1. The signal detector 3b includes a third switch circuit SW3 that applies the power supply potential VSS (or VDD) to the anode of the second photodiode PD2 and a fourth switch circuit SW4 that couples together the anode and the cathode of the second photodiode PD2. That is, the fourth switch circuit SW4 shorts both ends of the second photodiode PD2. FIG. 13 illustrates the sensor circuit 2a in the aspect illustrated in FIG. 12A.

The power supply potential VSS (or VDD) is applied from the signal detector 3b through the first switch circuit SW1 to the first power supply electrode EP1 coupled to the anode of the first photodiode PD1 of the sensor circuit 2a, and the cathode of the first photodiode PD1 is coupled to the inverting input (−) of the differential amplifier circuit forming the first detection circuit 31_1. The power supply potential VSS (or VDD) is applied from the signal detector 3b through the third switch circuit SW3 to the second power supply electrode EP2 coupled to the anode of the second photodiode PD2 of the sensor circuit 2a, and the cathode of the second photodiode PD2 is coupled to the inverting input (−) of the differential amplifier circuit forming the second detection circuit 31_2. A detection timing controller 5b performs on-off control of reset switch circuits RSW1 and RSW2 of the first and the second detection circuits 31_1 and 31_2, control of the sampling period of the first A/D converter (ADC1) 32_1 and the second A/D converter (ADC2) 32_2, on-off control of the first and the second switch circuits SW1 and SW2, and, in addition, on-off control of the third and the fourth switch circuits SW3 and SW4.

The signal detector 3b has two states of a first state in which the first switch circuit SW1 and the fourth switch circuit SW4 are controlled to be on and the second switch circuit SW2 and the third switch circuit SW3 are controlled to be off, and a second state in which the first switch circuit SW1 and the fourth switch circuit SW4 are controlled to be off and the second switch circuit SW2 and the third switch circuit SW3 are controlled to be on. The first switch circuit SW1 is controlled to be on or off by the first switch control signal SW1ctrl output from the detection timing controller 5b. The second switch circuit SW2 is controlled to be on or off by the second switch control signal SW2ctrl output from the detection timing controller 5b. The third switch circuit SW3 is controlled to be on or off by a third switch control signal SW3ctrl output from the detection timing controller 5b. The fourth switch circuit SW4 is controlled to be on or off by a fourth switch control signal SW4ctrl output from the detection timing controller 5b.

The switching between the first and the second states is synchronized with the frame in which the detection operation is performed. That is, the switching period between the first state and the second state is equal to the sampling period in the first A/D converter 32_1 and the second A/D converter 32_2.

Specifically, the detection timing controller 5b establishes the first state in odd-numbered frames 1F(1), 1F(3), . . . , illustrated in FIG. 14, and the second state in the even-numbered frames 1F(2), 1F(4), . . . , illustrated in FIG. 14. As a result, in the odd-numbered frames 1F(1), 1F(3), . . . , the first A/D converter 32_1 converts a first detection value V1 including the pulse wave component and the noise component output from the first detection circuit 31_1 into a discrete first detection value Data1, and the second A/D converter 32_2 converts a second detection value V2 including no pulse wave output from the second detection circuit 31_2 into a discrete second detection value Data2. In the even-numbered frames 1F(2), 1F(4), . . . , the first A/D converter 32_1 converts the first detection value V1 including no pulse wave output from the first detection circuit 31_1 into the discrete detection value Data1, and the second A/D converter 32_2 converts the second detection value V2 including the pulse wave component and the noise component output from the second detection circuit 31_2 into the discrete second detection value Data2.

The signal detector 3b outputs the absolute value (|Data1−Data2|) of the difference value (Data1−Data2) between the first detection value Data1 and the second detection value Data2 acquired in the same frame as the detection value Rawdata.

Specifically, the signal detector 3b includes, for example, the difference value calculator 33 and the absolute value calculator 35 (refer to FIG. 13). The difference value calculator 33 calculates the difference value (Data1−Data2) between the first detection value Data1 and the second detection value Data2 acquired in the same frame. The absolute value calculator 35 calculates the absolute value (|Data1−Data2|) of the difference value (Data1−Data2) output from the difference value calculator 33, and outputs the result as the detection value Rawdata.

Figure 15:
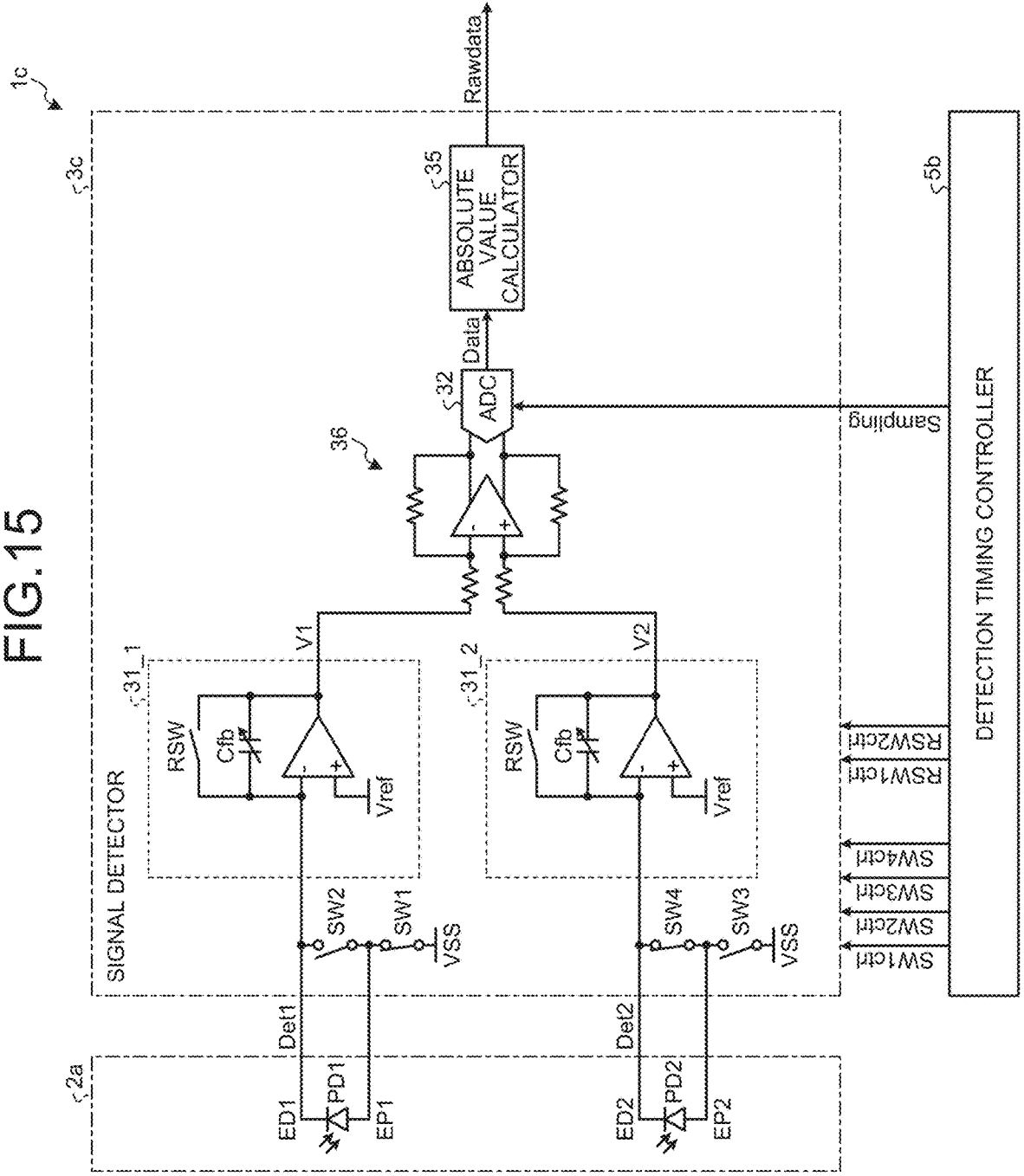
FIG. 15 is a block diagram illustrating a specific configuration of a detection device according to a first modification of the second embodiment.

FIG. 15 is a block diagram illustrating a specific configuration of a detection device according to a first modification of the second embodiment. A signal detector 3c of a detection device 1c illustrated in FIG. 15 causes the A/D converter 32 to convert the difference value between the first detection value V1 output from the first detection circuit 31_1 and the second detection value V2 output from the second detection circuit 31_2 into the discrete detection value Data, and outputs the absolute value (|Data1|) of the detection value Data as the detection value Rawdata.

Specifically, the signal detector 3c includes, for example, a difference detection circuit 36 and the absolute value calculator 35 (refer to FIG. 15). The difference detection circuit 36 calculates the difference value between the first detection value V1 output from the first detection circuit 31_1 and the second detection value V2 output from the second detection circuit 31_2. The A/D converter 32 converts the difference value between the first detection value V1 and the second detection value V2 into the discrete detection value Data1. The absolute value calculator 35 calculates the absolute value (|Data1−Data2|) of the difference value (Data1−Data2) output from the A/D converter 32, and outputs the result as the detection value Rawdata.

Figure 16:
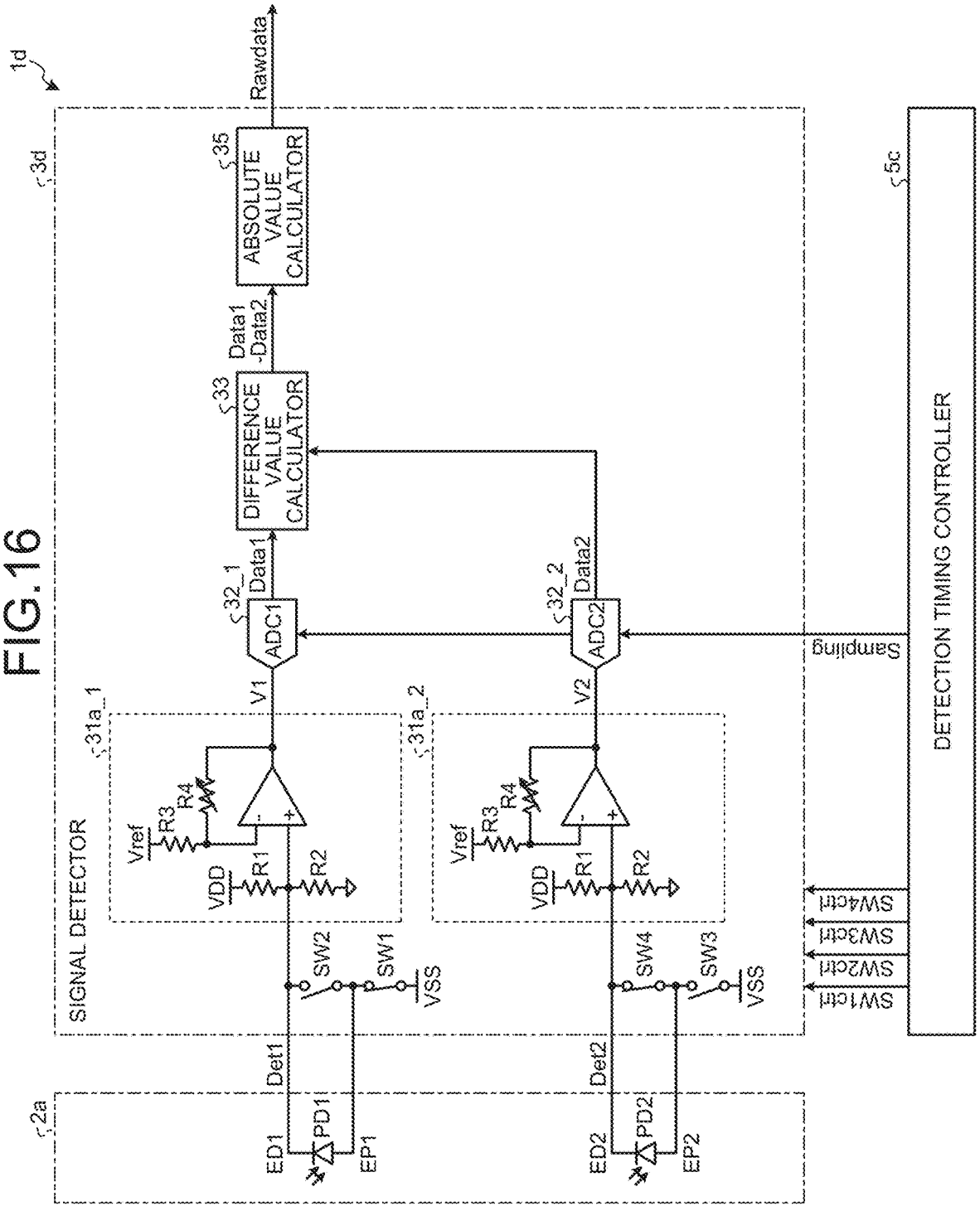
FIG. 16 is a block diagram illustrating a specific configuration of a detection device according to a second modification of the second embodiment.

FIG. 16 is a block diagram illustrating a specific configuration of a detection device according to a second modification of the second embodiment. Compared with the configuration illustrated in FIG. 14, a signal detector 3d of a detection device 1d illustrated in FIG. 16 has a modified configuration of a first detection circuit 31a_1 and a second detection circuit 31a_2. A detection timing controller 5c performs the on-off control of the first switch circuit SW1, the second switch circuit SW2, the third switch circuit SW3, and the fourth switch circuit SW4 in the same manner as the detection timing controller 5b illustrated in FIG. 13.

Figure 17:
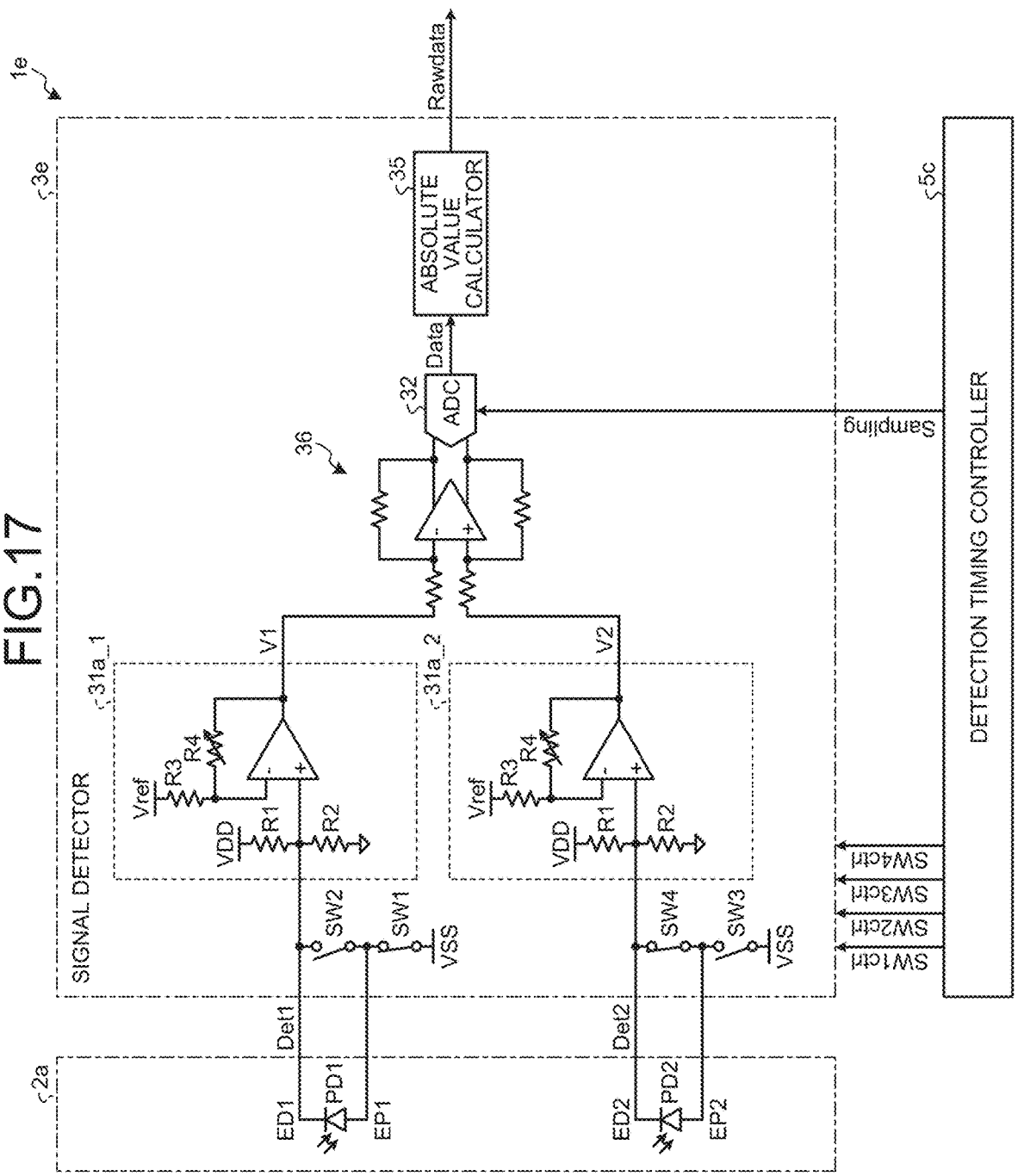
FIG. 17 is a block diagram illustrating a specific configuration of a detection device according to a third modification of the second embodiment.

FIG. 17 is a block diagram illustrating a specific configuration of a detection device according to a third modification of the second embodiment. Compared with the configuration illustrated in FIG. 16, a signal detector 3e of a detection device 1e illustrated in FIG. 17 has the modified configuration of the first detection circuit 31a_1 and the second detection circuit 31a_2.

In the same manner as in the case of the first embodiment, the configurations and the operations of the detection device 1b according to the second embodiment and the detection devices 1c, 1d, and 1e according to the modifications of the second embodiment described above can improve the ratio S/N of the biometric information data (such as the pulse wave data) serving as the detection target.

In the above-described configurations according to the second embodiment and the modifications of the second embodiment, the difference value between the first detection value of the first detection circuit and the second detection value of the second detection circuit in the same frame can be output as the detection value Rawdata. Thus, the resolution of the detection value Rawdata can be maintained.

In FIGS. 12A, 12B, and 12C, an area Ad1 of the first detection electrode ED1 is substantially equal to an area Ad2 of the second detection electrode ED2. However, in the second embodiment, for example, an aspect can be employed in which the area Ad1 of the first detection electrode ED1 differs from the area Ad2 of the second detection electrode ED2. In this case, the gain ratio G1/G2 of a gain G1 of the first detection circuit to a gain G2 of the second detection circuit only needs to be substantially equal to the reciprocal Ad2/Ad1 of the area ratio of the area Ad1 of the first detection electrode ED1 to the area Ad2 of the second detection electrode ED2.

The gain of the first and the second detection circuits is, for example, given as 1+R4/R3 in the configuration of the first detection circuit 31a_1 and the second detection circuit 31a_2 illustrated in FIG. 16 or 17. That is, in the configuration illustrated in FIG. 16 or 17, the resistance value of a resistor R4 of the first detection circuit 31a_1 and the resistance value of the resistor R4 of the second detection circuit 31a_2 only need to be set according to the area ratio of the area Ad1 of the first detection electrode ED1 to the area Ad2 of the second detection electrode ED2.

In the second embodiment described above, the example has been described in which the switching period between the first state and the second state is equal to the sampling period in the first A/D converter 32_1 and the second A/D converter 32_2. However, the state need not be switched between the first state and the second state. For example, in an aspect, the difference value (Data1−Data2) between the first detection value Data1 and the second detection value Data2 acquired in the same frame may be output as the detection value Rawdata while maintaining the first state, or the A/D converter may convert the difference value between the first detection value V1 output from the first detection circuit and the second detection value V2 output from the second detection circuit into the discrete detection value Rawdata. This aspect can omit the absolute value calculation process in the absolute value calculator 35.

Third Embodiment

The following describes details of differences from the first and the second embodiments described above, and may omit the same description as that of the first and the second embodiments.

Figure 18A:
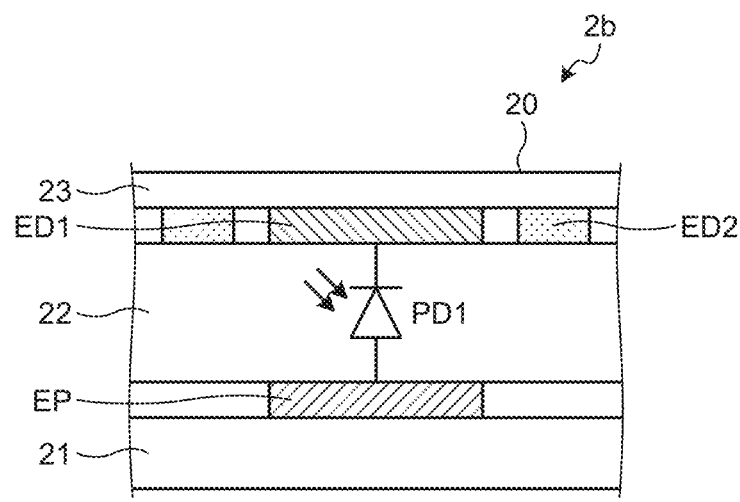
FIG. 18A is a sectional view illustrating a first example of a schematic configuration of a sensor circuit of a detection device according to a third embodiment.
Figure 18B:
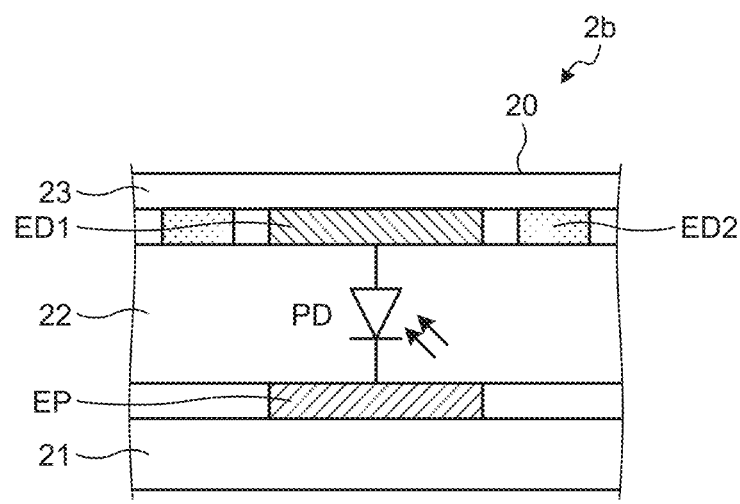
FIG. 18B is a sectional view illustrating a second example of the schematic configuration of the sensor circuit of the detection device according to the third embodiment.
Figure 18C:
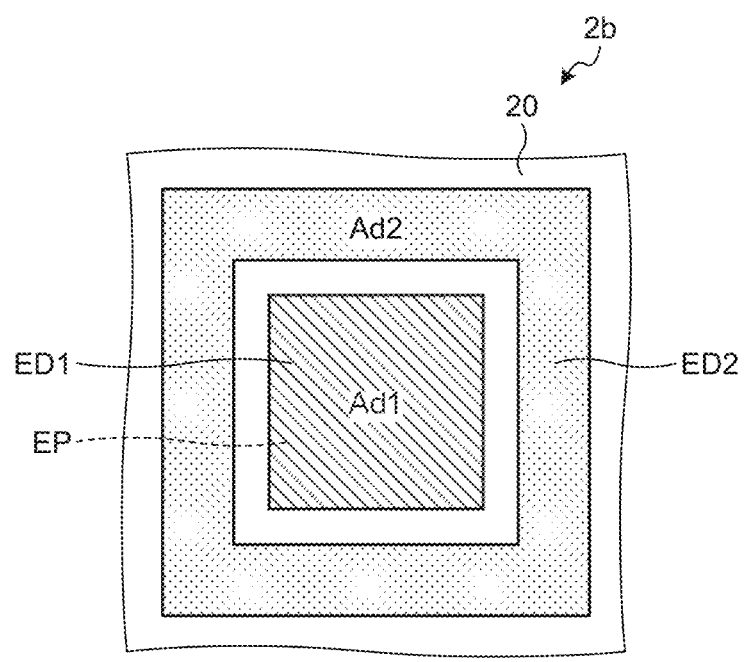
FIG. 18C is a plan view of the sensor circuit illustrated in FIGS. 18A and 18B as viewed from the detection surface side.

FIG. 18A is a sectional view illustrating a first example of a schematic configuration of a sensor circuit of a detection device according to a third embodiment. FIG. 18B is a sectional view illustrating a second example of the schematic configuration of the sensor circuit of the detection device according to the third embodiment. FIG. 18C is a plan view of the sensor circuit illustrated in FIGS. 18A and 18B as viewed from the detection surface side.

In the configuration illustrated in FIG. 18A, the anode of the photodiode (first photodiode) PD is coupled to the power supply electrode EP, and the cathode thereof is coupled to the first detection electrode ED1.

In the configuration illustrated in FIG. 18B, the cathode of the photodiode (first photodiode) PD is coupled to the power supply electrode EP, and the anode thereof is coupled to the first detection electrode ED1.

A sensor circuit 2b includes the second detection electrode ED2 provided adjacent to the first detection electrode ED1. Specifically, the second detection electrode ED2 is provided so as to surround the first detection electrode ED1, as illustrated in FIG. 18C.

Figure 19:
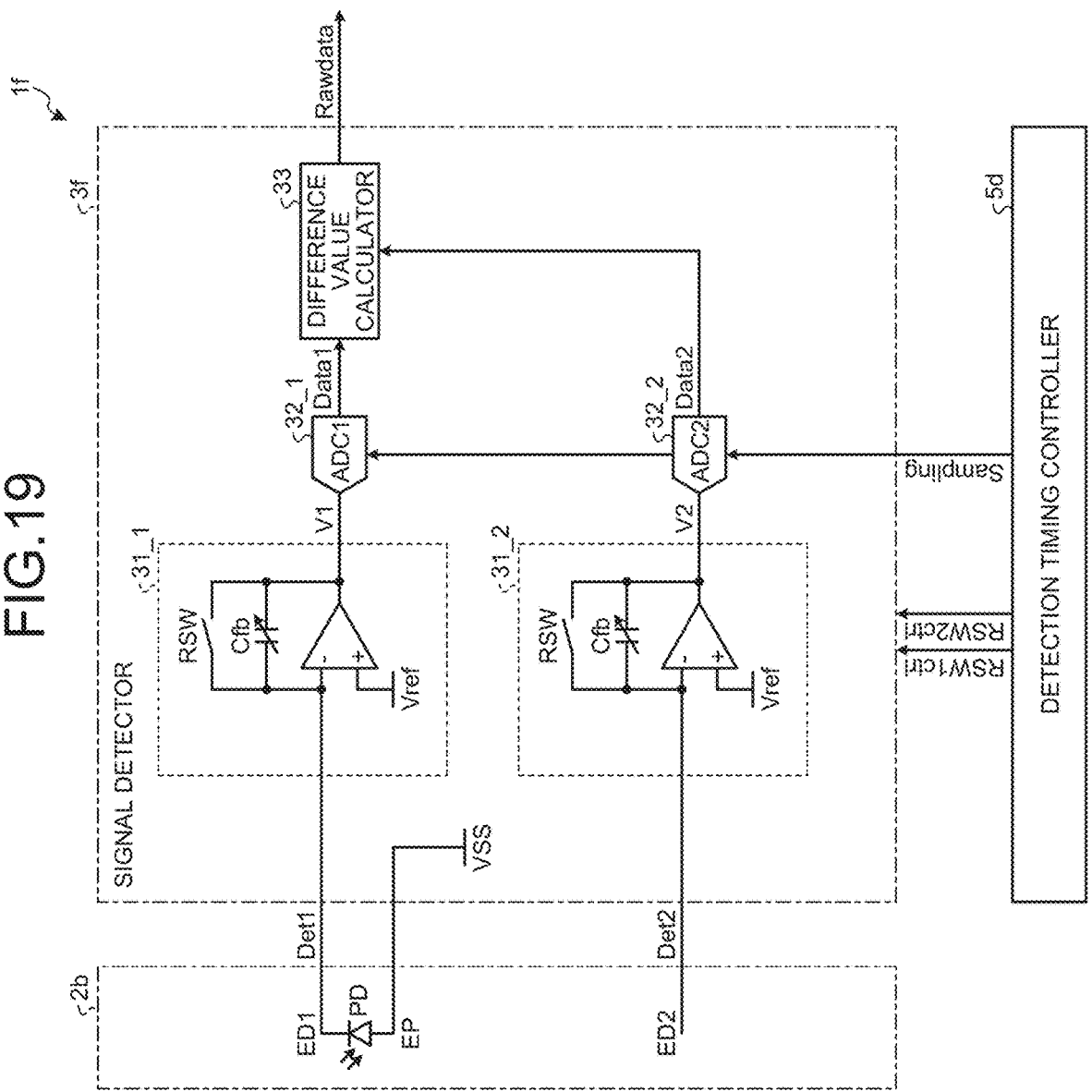
FIG. 19 is a block diagram illustrating a specific configuration of the detection device according to the third embodiment.
Figure 20:
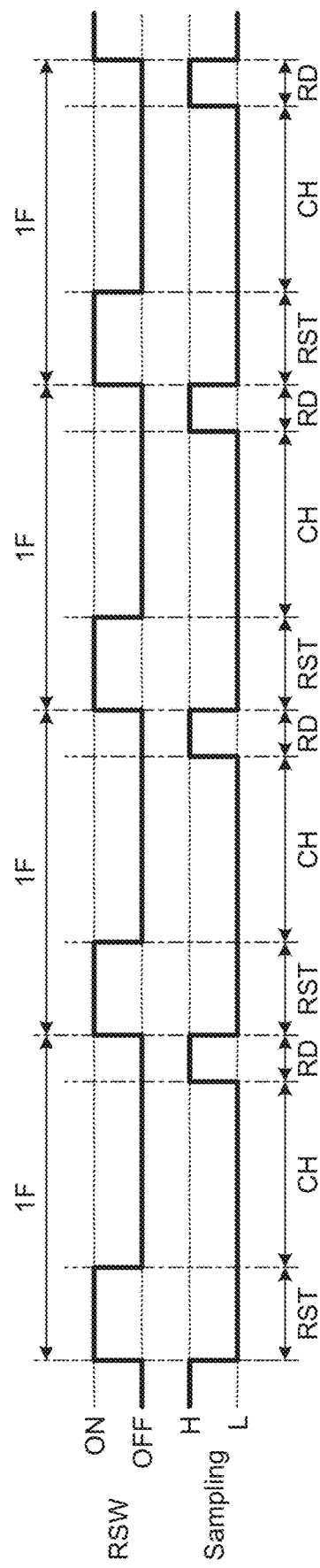
FIG. 20 is a timing waveform diagram illustrating a detection operation example of the detection device according to the third embodiment.

FIG. 19 is a block diagram illustrating a specific configuration of the detection device according to the third embodiment. FIG. 20 is a timing waveform diagram illustrating a detection operation example of the detection device according to the third embodiment.

A signal detector 3f includes the first detection circuit 31_1 and the second detection circuit 31_2 each formed of a differential amplifier circuit, the first A/D converter 32_1, and the second A/D converter 32_2, as a basic configuration for performing the detection operation.

The power supply potential VSS is applied from the signal detector 3e to the power supply electrode EP coupled to the anode of the photodiode PD in the sensor circuit 2b, and the cathode of the photodiode PD is coupled to the inverting input (−) of the differential amplifier circuit forming the first detection circuit 31_1.

The second detection electrode ED2 of the sensor circuit 2b is coupled to the inverting input (−) of the differential amplifier circuit forming the second detection circuit 31_2.

A detection timing controller 5d controls the reset switch circuit RSW of the first detection circuit 31 to be on during the reset period RST. This operation supplies the reference potential Vref applied to the non-inverting input (+) of the differential amplifier circuit of the first detection circuit 31_1 to the anode of the photodiode PD. In the configuration using the sensor circuit 2b in the aspect illustrated in FIG. 18A, the relation VSS<Vref holds. In the configuration using the sensor circuit 2b in the aspect illustrated in FIG. 18B, the power supply potential VDD is applied from the signal detector 3f to the power supply electrode EP coupled to the cathode of the photodiode PD in the sensor circuit 2b. This operation supplies the power supply potential VDD to the cathode of the photodiode PD, so that VDD>Vref. As a result, a reverse bias is applied between the anode and the cathode of the photodiode PD. At this time, the photodiode PD is charged with an electric charge corresponding to the reverse bias voltage.

In a detection device 1f according to the third embodiment, the first A/D converter 32_1 converts the first detection value V1 including the pulse wave component and the noise component output from the first detection circuit 31_1 into the discrete detection value Data1, and the second A/D converter 32_2 converts the second detection value V2 including no pulse wave output from the second detection circuit 31_2 into the discrete detection value Data2.

The signal detector 3f outputs the difference value (Data1−Data2) between the first detection value Data1 and the second detection value Data2 acquired during the same frame as the detection value Rawdata.

Specifically, the signal detector 3f includes, for example, the difference value calculator 33 (refer to FIG. 19). The difference value calculator 33 calculates the difference value (Data1−Data2) between the first detection value Data1 and the second detection value Data2 acquired in the same frame, and outputs the difference value (Data1−Data2) between the first detection value Data1 and the second detection value Data2 as the detection value Rawdata.

Figure 21:
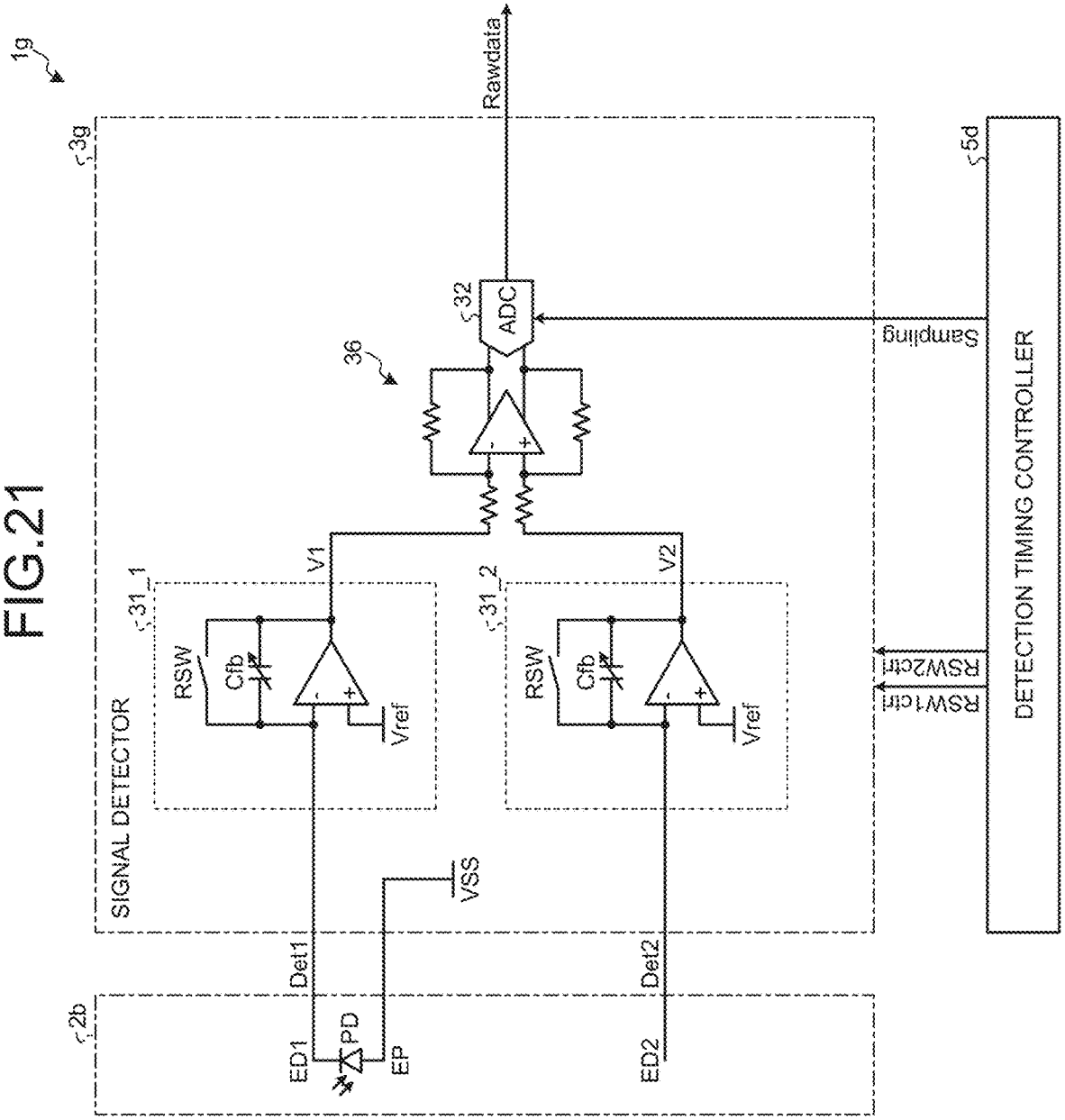
FIG. 21 is a block diagram illustrating a specific configuration of a detection device according to a first modification of the third embodiment.

FIG. 21 is a block diagram illustrating a specific configuration of a detection device according to a first modification of the third embodiment. A signal detector 3g of a detection device 1g illustrated in FIG. 21 causes the A/D converter 32 to convert the difference value between the first detection value V1 output from the first detection circuit 31_1 and the second detection value V2 output from the second detection circuit 31_2 into the discrete detection value Rawdata, and outputs the detection value Rawdata.

Specifically, the signal detector 3g includes, for example, the difference detection circuit 36 (refer to FIG. 21). The difference detection circuit 36 calculates the difference value between the first detection value V1 output from the first detection circuit 31_1 and the second detection value V2 output from the second detection circuit 31_2. The A/D converter 32 converts the difference value between the first detection value V1 and the second detection value V2 into the discrete detection value Rawdata, and outputs the detection value Rawdata.

Figure 22:
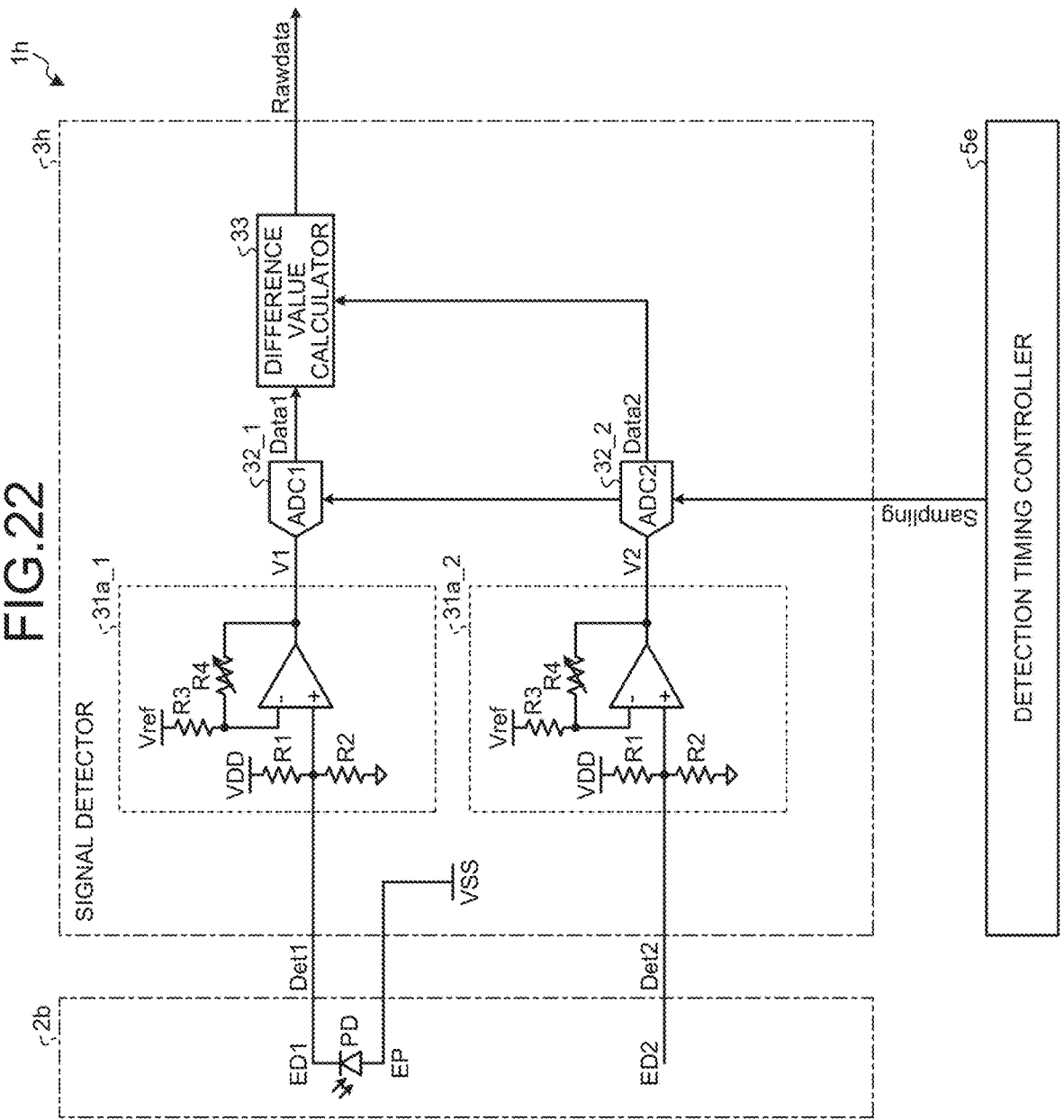
FIG. 22 is a block diagram illustrating a specific configuration of a detection device according to a second modification of the third embodiment.

FIG. 22 is a block diagram illustrating a specific configuration of a detection device according to a second modification of the third embodiment. Compared with the configuration illustrated in FIG. 19, a signal detector 3h of a detection device 1h illustrated in FIG. 22 has the modified configuration of the first detection circuit 31a_1 and the second detection circuit 31a_2. A detection timing controller 5e controls the sampling period of the first A/D converter 32_1 and the second A/D converter 32_2.

Figure 23:
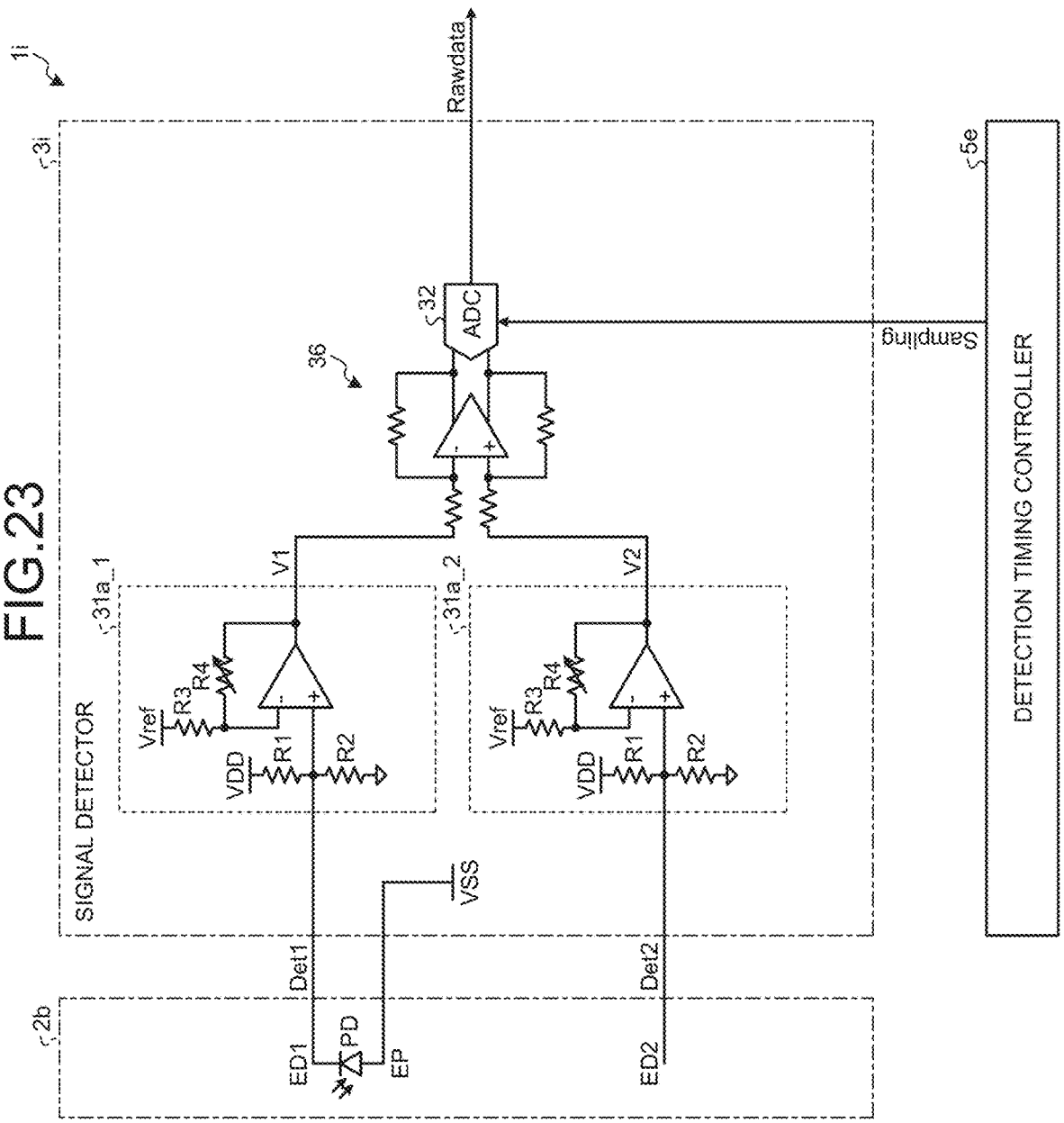
FIG. 23 is a block diagram illustrating a specific configuration of a detection device according to a third modification of the third embodiment.

FIG. 23 is a block diagram illustrating a specific configuration of a detection device according to a third modification of the third embodiment. Compared with the configuration illustrated in FIG. 21, a signal detector 3i of a detection device 1i illustrated in FIG. 23 has the modified configuration of the first detection circuit 31a_1 and the second detection circuit 31a_2.

In the same manner as in the cases of the first and the second embodiments, the configurations and the operations of the detection device 1f according to the third embodiment and the detection devices 1g, 1h, and 1i according to the modifications of the third embodiment described above can improve the ratio S/N of the biometric information data (such as the pulse wave data) serving as the detection target.

In the above-described configurations according to the third embodiment and the modifications of the third embodiment, the difference value between the first detection value of the first detection circuit and the second detection value of the second detection circuit can be output as the detection value Rawdata in all frames. This feature eliminates the need for a switch circuit for switching between the first state and the second state, unlike in the first and the second embodiments. The absolute value calculation process is also not required.

In the third embodiment, when the area Ad1 of the first detection electrode ED1 differs from the area Ad2 of the second detection electrode ED2, the gain ratio G1/G2 of the gain G1 of the first detection circuit to the gain G2 of the second detection circuit only needs to be substantially equal to the reciprocal Ad2/Ad1 of the area ratio of the area Ad1 of the first detection electrode ED1 to the area Ad2 of the second detection electrode ED2, in the same manner as in the second embodiment.

In the same manner as in the second embodiment, the gain of the first and the second detection circuits is, for example, given as 1+R4/R3 in the configuration of the first detection circuit 31a_1 and the second detection circuit 31a_2 illustrated in FIG. 22 or 23. That is, in the configuration illustrated in FIG. 22 or 23, the resistance value of the resistor R4 of the first detection circuit 31a_1 and the resistance value of the resistor R4 of the second detection circuit 31a_2 only need to be set according to the area ratio of the area Ad1 of the first detection electrode ED1 to the area Ad2 of the second detection electrode ED2.

In FIGS. 4, 8, 13, 15, 19, and 20, the negative feedback capacitor Cfb is a variable capacitor, but is not limited thereto, and may be a fixed capacitor. In this case, the negative feedback capacitor Cfb only needs to be set to have an optimal capacitance value according to specifications of the sensor circuit. In FIGS. 11, 16, 17, 22, and 23, the resistor R4 is a variable resistor, but is not limited thereto, and may be a fixed resistor. In this case, the resistor R4 only needs to be set to have an optimal resistance value according to the specifications of the sensor circuit. The capacitance values of the negative feedback capacitors Cfb and resistance values of resistors R1, R2, R3, and R4 in the detection circuit, the first detection circuit, and the second detection circuit only need to be appropriately set according to the difference in area ratio and other various characteristics of the detection electrode, the first detection electrode, and the second detection electrode, and may be set to the same constant values or different constant values among the detection circuits.

While the preferred embodiments of the present disclosure have been described above, the present disclosure is not limited to the embodiments described above. The content disclosed in the embodiments is merely an example, and can be variously modified within the scope not departing from the gist of the present disclosure. Any modifications appropriately made within the scope not departing from the gist of the present disclosure also naturally belong to the technical scope of the present disclosure. At least one of various omissions, substitutions, and changes of the components can be made without departing from the gist of the embodiments and the modifications described above.

What is claimed is:

1. A detection device comprising:
   a sensor circuit provided with a first photodiode in a semiconductor layer; and
   a signal detector configured to acquire a detection value corresponding to a signal output from the sensor circuit, wherein
   the signal detector comprises:
      a first detection circuit coupled to one end of the first photodiode;
      a first switch circuit configured to apply a power supply potential to another end of the first photodiode; and
      a second switch circuit configured to short both ends of the first photodiode, and
   wherein the signal detector has:
      a first state in which the first switch circuit is controlled to be on and the second switch circuit is controlled to be off; and
      a second state in which the first switch circuit is controlled to be off and the second switch circuit is controlled to be on, and
   is configured to output a difference value between a detection value acquired by the first detection circuit in the first state and a detection value acquired by the first detection circuit in the second state.

2. The detection device according to claim 1, wherein the sensor circuit comprises a first detection electrode that is provided on a detection surface side of the semiconductor layer, and coupled to the one end of the first photodiode.

3. The detection device according to claim 1, wherein the sensor circuit further comprises a second photodiode provided adjacent to the first photodiode, and the signal detector further comprises:
   a second detection circuit coupled to one end of the second photodiode;
   a third switch circuit configured to apply the power supply potential to another end of the second photodiode; and
   a fourth switch circuit configured to short both ends of the second photodiode.

4. The detection device according to claim 3, wherein the sensor circuit comprises:
   a first detection electrode that is provided on a detection surface side of the semiconductor layer, and coupled to the one end of the first photodiode; and
   a second detection electrode that is provided adjacent to the first detection electrode, and coupled to the one end of the second photodiode, and
   a gain ratio of a gain of the first detection circuit to that of the second detection circuit is set to be substantially equal to a reciprocal of an area ratio of an area of the first detection electrode to that of the second detection electrode.

5. The detection device according to claim 1, wherein the sensor circuit comprises:
   a first detection electrode that is provided on a detection surface side of the semiconductor layer, and coupled to the one end of the first photodiode; and
   a second detection electrode provided adjacent to the first detection electrode, and
   the signal detector comprises a second detection circuit coupled to the second detection electrode, and
   is configured to output a difference value between a first detection value acquired by the first detection circuit and a second detection value acquired by the second detection circuit.

6. The detection device according to claim 5, wherein a gain ratio of a gain of the first detection circuit to that of the second detection circuit is set to be substantially equal to a reciprocal of an area ratio of an area of the first detection electrode to that of the second detection electrode.

7. The detection device according to claim 5, wherein the second detection electrode is provided so as to surround the first detection electrode.

8. A detection device comprising:
   a sensor circuit provided with a first photodiode in a semiconductor layer; and
   a signal detector configured to acquire a detection value corresponding to a signal output from the sensor circuit,
   wherein the signal detector comprises:
      a first detection circuit coupled to one end of the first photodiode;
      a first switch circuit configured to apply a power supply potential to another end of the first photodiode; and
      a second switch circuit configured to short both ends of the first photodiode,
   the sensor circuit further comprises a second photodiode provided adjacent to the first photodiode,
   wherein the signal detector further comprises:
      a second detection circuit coupled to one end of the second photodiode;
      a third switch circuit configured to apply the power supply potential to another end of the second photodiode; and
      a fourth switch circuit configured to short both ends of the second photodiode, and
   wherein the signal detector has:
      a first state in which the first switch circuit and the fourth switch circuit are controlled to be on, and the second switch circuit and the third switch circuit are controlled to be off; and a second state in which the first switch circuit and the fourth switch circuit are controlled to be off, and the second switch circuit and the third switch circuit are controlled to be on, and is configured to alternately output a difference value between a first detection value acquired by the first detection circuit and a second detection value acquired by the second detection circuit in the first state and a difference value between a first detection value acquired by the first detection circuit and a second detection value acquired by the second detection circuit in the second state.

\* \* \* \* \*